(12) United States Patent
Yamagami

(10) Patent No.: US 7,433,257 B2
(45) Date of Patent: Oct. 7, 2008

(54) SEMICONDUCTOR MEMORY DEVICE

(75) Inventor: Yoshinobu Yamagami, Nagaokakyo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/193,379

(22) Filed: Aug. 1, 2005

(65) Prior Publication Data
US 2006/0028896 A1    Feb. 9, 2006

(30) Foreign Application Priority Data

Aug. 4, 2004 (JP) ............................. 2004-228553
Oct. 25, 2004 (JP) ............................. 2004-310078

(51) Int. Cl.
G11C 5/14 (2006.01)
G11C 11/413 (2006.01)
(52) U.S. Cl. ........................ 365/226; 365/227
(58) Field of Classification Search ................ 365/226, 365/227, 228, 229, 154, 230.06
See application file for complete search history.

(56) References Cited

U.S. PATENT DOCUMENTS

| | | | |
|---|---|---|---|
| 4,996,671 A * | 2/1991 | Suzuki et al. ............. | 365/203 |
| 5,568,061 A * | 10/1996 | McClure .................. | 326/13 |
| 5,581,500 A * | 12/1996 | D'Souza .................. | 365/156 |
| 5,600,588 A | 2/1997 | Kawashima | |
| 5,991,191 A * | 11/1999 | Rao ........................ | 365/154 |
| 5,999,442 A * | 12/1999 | Van Der Sanden et al. .. | 365/154 |
| 6,934,181 B2 * | 8/2005 | Chu et al. ................ | 365/154 |
| 2004/0042326 A1 * | 3/2004 | Ashizawa ................ | 365/232 |
| 2004/0090820 A1 * | 5/2004 | Pathak et al. ............ | 365/154 |
| 2004/0125681 A1 | 7/2004 | Yamaoka et al. | |
| 2006/0023519 A1 * | 2/2006 | Choi et al. .............. | 365/189.09 |

FOREIGN PATENT DOCUMENTS

| | | |
|---|---|---|
| CN | 1516194 | 7/2004 |
| JP | 7-211079 A | 8/1995 |
| JP | 10-112188 A | 4/1998 |

* cited by examiner

Primary Examiner—Richard Elms
Assistant Examiner—Douglas King
(74) Attorney, Agent, or Firm—McDermott Will & Emery LLP

(57) ABSTRACT

When a memory cell is inactive, a memory cell power supply voltage control circuit decreases the power supply voltage supplied to the memory cell down to a memory cell holding voltage, thereby reducing the leak current flowing in the memory cell. By reducing the leak current, it is possible to reduce the power consumption of a semiconductor memory device and to increase the operating speed thereof. Moreover, the threshold voltage of transistors in the memory cell is kept low, thereby improving the operating characteristics of the semiconductor memory device at low power supply voltages.

15 Claims, 17 Drawing Sheets

SEMICONDUCTOR MEMORY DEVICE

BACKGROUND OF THE INVENTION

1. Field of the Invention

The present invention relates to a semiconductor memory device, and more particularly to a semiconductor memory device having a memory cell array section with a reduced power consumption and an increased speed.

2. Description of the Background Art

In recent years, finer process rules for semiconductor integrated circuits are imposing problems such as an increase in the leak current of transistors on standby (e.g., the OFF leak current or the gate leak current). Moreover, the capacity of a semiconductor memory device such as an SRAM, a DRAM and a ROM has been increasing rapidly. As a result, the power consumption of memory cell arrays included in a semiconductor memory device of a semiconductor integrated circuit accounts for a large portion of the total power consumption of the entire semiconductor integrated circuit. Therefore, in order to reduce the power consumption of a semiconductor integrated circuit, it is effective to reduce the power consumption of the memory cell arrays included in the semiconductor memory device.

A conventional technique for reducing the power consumption of memory cell arrays included in a semiconductor memory device is disclosed in Japanese Laid-Open Patent Publication No. 7-211079, for example. In the semiconductor memory device disclosed in Japanese Laid-Open Patent Publication No. 7-211079, a back-bias voltage is supplied to the substrate electrode of an N-type MOS transistor forming a memory cell, thereby reducing the leak current due to the subthreshold current in a standby state. Therefore, the power consumption of the semiconductor memory device is reduced.

Another conventional method is disclosed in Japanese Laid-Open Patent Publication No. 10-112188. FIG. 17 shows a configuration of a semiconductor memory device disclosed in Japanese Laid-Open Patent Publication No. 10-112188. The semiconductor memory device shown in FIG. 17 includes a memory cell array 17 including m rows by n columns of complete CMOS-type memory cells 7. The memory cell 7 includes load P-type MOSFETs (hereinafter referred to as "load PMOSs") 1 and 2, driving N-type MOSFETs (hereinafter referred to as "driving NMOSs") 3 and 4, and transfer N-type MOSFETs (hereinafter referred to as "transfer NMOSs") 5 and 6.

The source electrodes of load PMOSs 1 and 2, a substrate electrode 15 of the load PMOS 1 and a substrate electrode 16 of the load PMOS 2 are all connected to a power supply terminal 8 (a power supply voltage VDD). The drain electrodes of the load PMOSs 1 and 2 are connected to memory nodes 20 and 21, respectively, of the memory cell. A substrate electrode 13 of the driving NMOS 3 and a substrate electrode 14 of a driving NMOS 4 are both connected to a ground terminal 9 (a ground potential VSS). The source electrodes of the driving NMOSs 3 and 4 are both connected to a source line 23, and the drain electrodes thereof are connected to the memory nodes 20 and 21, respectively.

A substrate electrode 11 of a transfer NMOS 5 and a substrate electrode 12 of a transfer NMOS 6 are both connected to the ground terminal 9. The gate electrodes of the transfer NMOSs 5 and 6 are both connected to a word line 22, the drain electrodes thereof are connected to bit lines 18 and 19, respectively, and the source electrodes thereof are connected to the memory nodes 20 and 21, respectively. The memory node 20 is connected to the gate electrode of the load PMOS 2 and that of the driving NMOS 4, and the memory node 21 is connected to the gate electrode of the load PMOS 1 and that of the driving NMOS 3. Thus, the load PMOSs 1 and 2 and the driving NMOSs 3 and 4 in the memory cell 7 together form a latch circuit.

A switching circuit 33 is connected to the memory cell 7 via the source line 23. While the configuration of the switching circuit 33 will not be described in detail, the operation thereof will be described briefly. The switching circuit 33 supplies the ground potential VSS to the source line 23 that is connected to the memory cell 7 in an active state, and supplies an intermediate potential between the power supply voltage VDD and the ground potential VSS (the intermediate potential is set to 0.5 V in an embodiment of Japanese Laid-Open Patent Publication No. 10-112188) to the source line 23 that is connected to the memory cell 7 in an inactive state.

When the memory cell 7 is inactive, the switching circuit 33 increases the potential of the source line 23 connected to the memory cell 7 to the intermediate potential. As a result, the threshold voltage of the driving NMOSs 3 and 4 increases due to the substrate bias effect, thereby reducing the leak current due to the subthreshold current from the memory cell 7. As described above, in the semiconductor memory device disclosed in Japanese Laid-Open Patent Publication No. 10-112188, the source potential of the driving NMOSs of each memory cell is controlled by the switching circuit, thus reducing the power consumption.

However, the conventional semiconductor memory device described above has the following problems. In either of the semiconductor memory devices disclosed in Japanese Laid-Open Patent Publication Nos. 7-211079 and 10-112188, the leak current from a memory cell is reduced by increasing the threshold voltage of the transistor utilizing the substrate bias effect. Therefore, with these devices, the threshold voltage of the transistor increases, thereby deteriorating the operation characteristics of the transistor at low power supply voltages. The semiconductor memory device disclosed in Japanese Laid-Open Patent Publication No. 7-211079 has a problem in that it is necessary to provide a control circuit for supplying the back-bias voltage, thereby increasing the circuit area. The semiconductor memory device disclosed in Japanese Laid-Open Patent Publication No. 10-112188 also has a problem in that it is necessary to provide a switching circuit for supplying a voltage to the source line, thereby increasing the circuit area.

SUMMARY OF THE INVENTION

Therefore, an object of the present invention is to effectively suppress the leak current in memory cells so as to provide a low-power-consumption, high-speed semiconductor memory device with desirable operating characteristics at low power supply voltages.

A semiconductor memory device of the present invention includes: a plurality of word lines; a plurality of bit lines; a plurality of power supply lines; a plurality of memory cells connected to the word lines, the bit lines and the power supply lines; and a memory cell power supply voltage control circuit for supplying a predetermined power supply voltage via a power supply line to the memory cell that is connected to a word line being active, and for supplying, via a power supply line to a memory cell that is connected to a word line being inactive, a voltage that is lower than the predetermined power supply voltage and is greater than or equal to a lowest possible level with which the memory cells can hold data.

In a preferred embodiment, the memory cell power supply voltage control circuit includes first to third transistors; the first transistor is connected to a power supply terminal, to which the predetermined power supply voltage is applied, and the second transistor; the second transistor is connected in a diode-type gate connection between the first transistor and the third transistor; the third transistor is connected to the second transistor and a ground terminal; and the first and third transistors are controlled based on an external addressing signal.

In a preferred embodiment, an absolute value of a threshold voltage of the second transistor is greater than or equal to a maximum threshold voltage among all transistors included in the memory cell.

In a preferred embodiment, the memory cell power supply voltage control circuit outputs the predetermined power supply voltage when the addressing signal exhibits an active state and outputs the threshold voltage of the second transistor when the addressing signal exhibits an inactive state.

In a preferred embodiment, the memory cell power supply voltage control circuit supplies the predetermined power supply voltage to the memory cell before the word line becomes active.

In a preferred embodiment, the memory cell power supply voltage control circuit supplies the same power supply voltage to a plurality of the memory cells connected to a plurality of the word lines.

In a preferred embodiment, the power supply line extends in a substrate potential supplying region in a memory cell array including the memory cell; the memory cell power supply voltage control circuit is provided in a region adjacent to the substrate potential supplying region and adjacent to a word line driver circuit region.

In a preferred embodiment, the semiconductor memory device of the present invention further includes a memory cell power supply voltage compensation circuit for preventing the power supply voltage supplied to the memory cell from becoming lower than the lowest possible level with which the memory cell can hold data.

In a preferred embodiment, the memory cell power supply voltage compensation circuit includes a charge-supplying element connected to a power supply terminal, to which the predetermined power supply voltage is applied, and the power supply line.

In a preferred embodiment, the first transistor functions as the memory cell power supply voltage compensation circuit.

In a preferred embodiment, the memory cell power supply voltage compensation circuit includes: a comparator circuit for comparing a power supply voltage supplied to the memory cell via the power supply line with a reference voltage of the power supply voltage; and a switching element for electrically connecting and shorting together a power supply terminal, to which the predetermined power supply voltage is applied, and the power supply line according to a signal outputted from the comparator circuit, wherein the power supply voltage supplied to the memory cell is kept to be greater than or equal to the reference voltage.

In a preferred embodiment, the comparator circuit and the switching element stop operating when an external addressing signal exhibits an active state.

In a preferred embodiment, the semiconductor memory device of the present invention further includes: a bit line precharge control signal line for carrying a control signal for controlling whether or not to precharge the bit line; a bit line precharge circuit connected to the bit line and the bit line precharge control signal line for precharging the bit line based on the control signal; and a bit line precharge control circuit for outputting the control signal to the bit line precharge control signal line based on an external signal, wherein when the word line transitions from an active state to an inactive state, the bit line precharge control circuit supplies a charge stored in the power supply line of the memory cell that is connected to the word line to the bit line precharge control signal line.

In a preferred embodiment, the semiconductor memory device of the present invention further includes a redundancy block, wherein: redundancy block includes a redundancy memory cell that can be used as a replacement for the memory cell, and a switching element for controlling a power supply voltage supplied to the redundancy memory cell to be either a power supply voltage supplied from the memory cell power supply voltage control circuit or a ground potential; and the switching element outputs the ground potential in a redundancy block including a redundancy memory cell that is not used as a replacement for the memory cell.

In a preferred embodiment, the semiconductor memory device of the present invention further includes: a redundancy memory cell that can be used as a replacement for the memory cell; and a switching element for controlling a power supply voltage supplied to the memory cell to be either a power supply voltage supplied from the memory cell power supply voltage control circuit or a ground potential, wherein the switching element outputs the ground potential in a memory cell that is replaced by the redundancy memory cell.

These and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
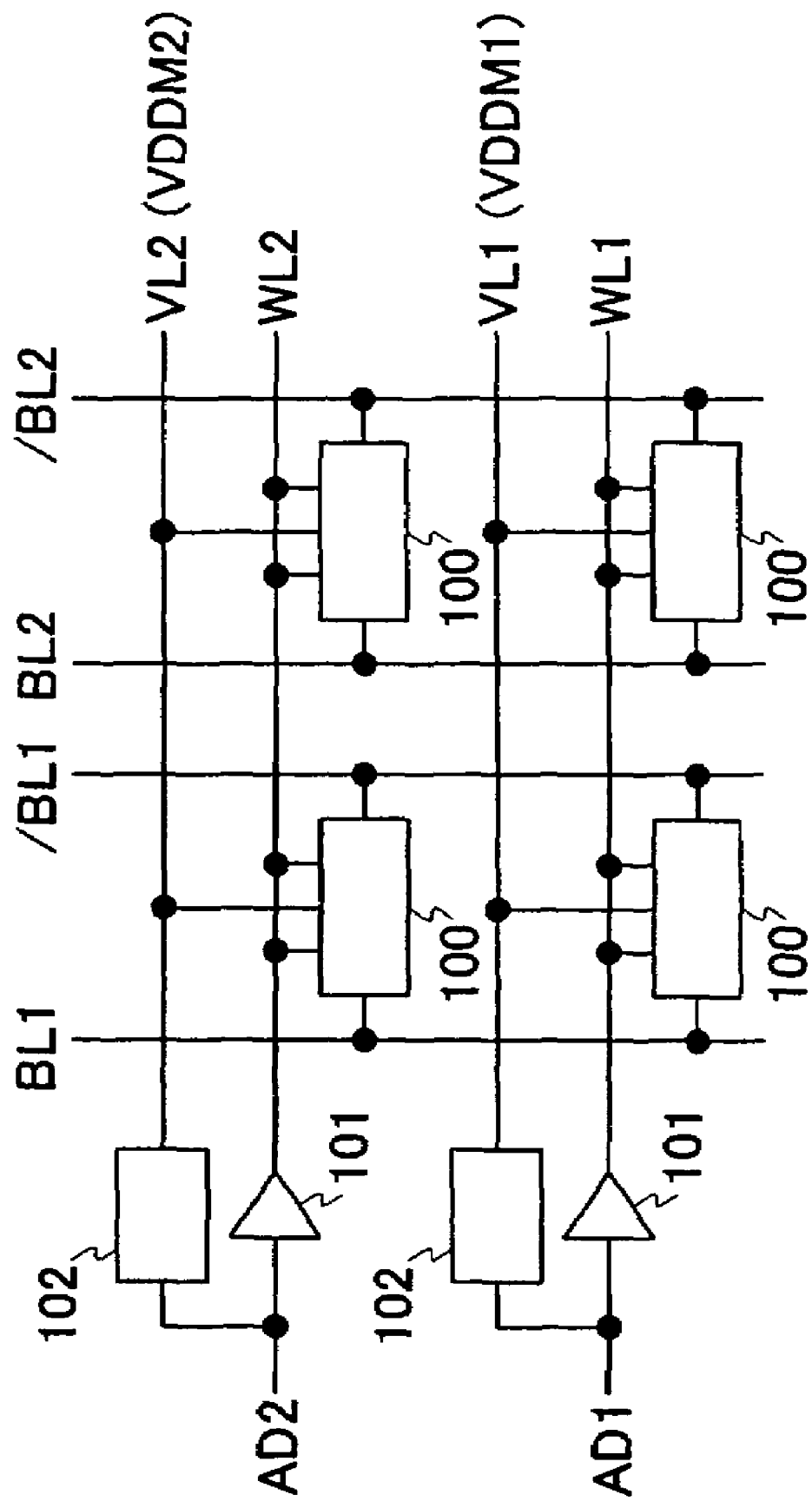
FIG. 1 shows a configuration of a semiconductor memory device according to a first embodiment of the present invention.

FIG. 1 shows a configuration of a semiconductor memory device according to a first embodiment of the present invention. The semiconductor memory device shown in FIG. 1 includes memory cells 100, word line driver circuits 101, memory cell power supply voltage control circuits 102, word lines WL1 and WL2, bit lines BL1, BL2, /BL1 and /BL2, and power supply lines VL1 and VL2. Each memory cell 100 is connected to the word line WL1 (or WL2), the bit lines BL1 and /BL1 (or BL2 and /BL2) and the power supply line VL1 (or VL2).

Figure 2:
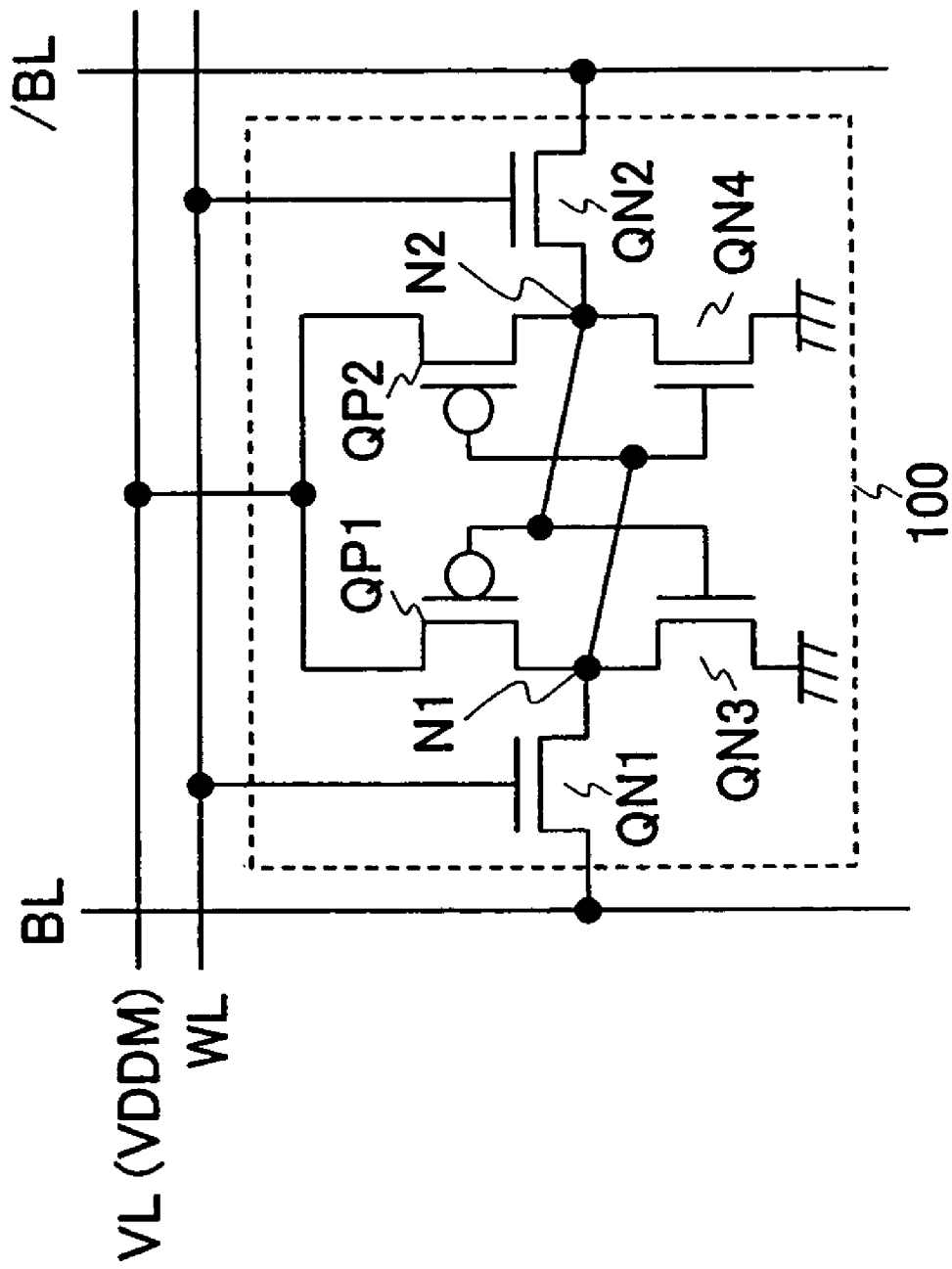
FIG. 2 shows a configuration of a memory cell provided in the semiconductor memory device according to the first embodiment of the present invention.

Referring now to FIG. 2, a configuration of the memory cell 100 will be described. The memory cell 100 shown in FIG. 2 includes P-type MOS transistors QP1 and QP2 and N-type MOS transistors QN1 to QN4. The source electrodes of the P-type MOS transistors QP1 and QP2 are both connected to a power supply line VL. The drain electrodes of the P-type MOS transistors QP1 and QP2 are connected to memory nodes N1 and N2, respectively, of the memory cell. The source electrodes of the P-type MOS transistors QP1 and QP2 receive a memory cell power supply voltage VDDM from the memory cell power supply voltage control circuit 102 via the power supply line VL.

The source electrodes of the N-type MOS transistors QN3 and QN4 are both grounded. The drain electrodes of the N-type MOS transistors QN3 and QN4 are connected to the memory nodes N1 and N2, respectively.

The source electrodes of the N-type MOS transistors QN1 and QN2 are connected to the memory nodes N1 and N2, respectively. The gate electrodes of the N-type MOS transistors QN1 and QN2 are both connected to a word line WL. The drain electrode of the N-type MOS transistor QN1 is connected to a bit line BL, and the drain electrode of the N-type MOS transistor QN2 is connected to a bit line /BL. The gate electrodes of the N-type MOS transistors QN1 and QN2 receive an addressing signal AD from the word line driver circuit 101 via the word line WL.

The memory node N1 is connected to the gate electrodes of the P-type MOS transistor QP2 and the N-type MOS transistor QN4, and the memory node N2 is connected to the gate electrodes of the P-type MOS transistor QP1 and the N-type MOS transistor QN3. Thus, the P-type MOS transistors QP1 and QP2 and the N-type MOS transistors QN3 and QN4 in the memory cell 100 together form a latch circuit.

The latch circuit stores and holds data. The memory cell 100 reads or writes data when the word line is at an H level. Reading data means outputting data stored in the latch circuit to the bit lines BL and /BL, whereas writing data means receiving and storing, in the latch circuit, complementary data transferred via the bit lines BL and /BL. When the word line is at an L level, the memory cell 100 does not read or write data, and holds the data stored in the latch circuit.

Figure 3:
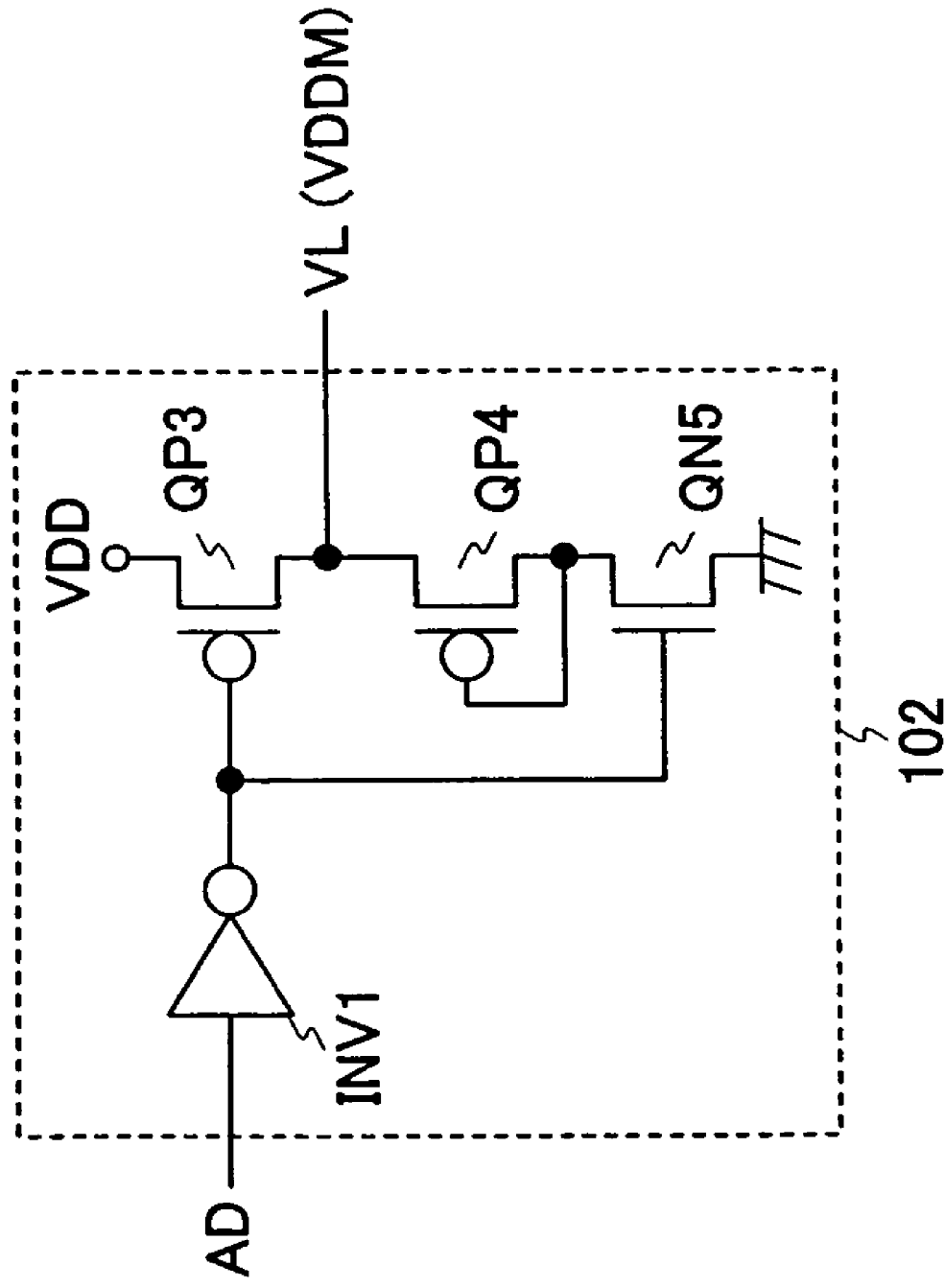
FIG. 3 shows a configuration of a memory cell power supply voltage control circuit provided in the semiconductor memory device according to the first embodiment of the present invention.

Referring now to FIG. 3, a configuration of the memory cell power supply voltage control circuit 102 will be described. The memory cell power supply voltage control circuit 102 shown in FIG. 3 includes an inverter INV1, P-type MOS transistors QP3 and QP4, and an N-type MOS transistor QN5. The memory cell power supply voltage control circuit 102 is a circuit for controlling the power supply voltage supplied to memory cells based on the state (active or inactive) of the word line connected to the memory cells.

The source electrode of the P-type MOS transistor QP3 is connected to a power supply terminal VDD, the drain electrode thereof is connected to the power supply line VL and the source electrode of the P-type MOS transistor QP4, and the gate electrode thereof is connected to the output of the inverter INV1. The P-type MOS transistor QP4 is connected in a diode-type gate connection between the P-type MOS transistor QP3 and the N-type MOS transistor QN5. Specifically, the gate electrode and the drain electrode of the P-type MOS transistor QP4 are connected to the drain electrode of the N-type MOS transistor QN5, and the source electrode of the P-type MOS transistor QP4 is connected to the drain electrode of the P-type MOS transistor QP3 and the power supply line VL. The gate electrode of the N-type MOS transistor QN5 is connected to the output of the inverter INV1, and the source electrode thereof is grounded.

Referring now to FIG. 3, an operation of the memory cell power supply voltage control circuit 102 will be described. When an H-level addressing signal AD is inputted to the inverter INV1, the gate electrode of the P-type MOS transistor QP3 and the gate electrode of the N-type MOS transistor QN5 will be at the L level. As a result, the P-type MOS transistor QP3 is turned on and the N-type MOS transistor QN5 is turned off, whereby the power supply voltage VDD is outputted from the memory cell power supply voltage control circuit 102 as the memory cell power supply voltage VDDM.

When an L-level addressing signal AD is inputted to the inverter INV1, the gate electrode of the P-type MOS transistor QP3 and the gate electrode of the N-type MOS transistor QN5 will be at the H level. As a result, the P-type MOS transistor QP3 is turned off, and the N-type MOS transistor QN5 is turned on. Then, the potential of the power supply line VL will be equal to the absolute value of the threshold voltage (hereinafter referred to as "VTP") of the P-type MOS transistor QP4 connected in a diode-type connection, and the absolute value of the threshold voltage VTP (<VDD) of the P-type MOS transistor QP4 will be outputted from the memory cell power supply voltage control circuit 102 as the memory cell power supply voltage VDDM.

An operation of the semiconductor memory device of the present embodiment shown in FIG. 1 will now be described. Referring to FIG. 1, if an H-level addressing signal AD1 is inputted to the word line WL1, for example, the word line WL1 will be active and the memory cells 100 connected to the word line WL1 will therefore be active. Then, a memory cell power supply voltage VDDM1 supplied to the memory cells connected to the word line WL1 is the power supply voltage VDD as described above. Then, if an L-level addressing signal AD2 is inputted to the word line WL2, the word line WL2 will be inactive and the memory cells 100 connected to the word line WL2 will therefore be inactive. Then, a memory cell power supply voltage VDDM2 supplied to the memory cells connected to the word line WL2 is equal to VTP.

In conventional semiconductor memory devices, the memory cell power supply voltage is the power supply voltage VDD irrespective of whether the word line is active or inactive. In contrast, in the semiconductor memory device of the present embodiment, the memory cell power supply voltage for memory cells connected to an inactive word line (e.g., the memory cells connected to the word line WL2) is decreased to VTP. In the semiconductor memory device of the present embodiment, the memory cell power supply voltage supplied to memory cells connected to an inactive word line is decreased so as to reduce the leak current from the memory cells.

However, if the memory cell power supply voltage is overly decreased, data stored in the memory cells will be lost. Therefore, it is necessary to keep the memory cell power supply voltage at levels such that the memory cells can properly hold the data stored therein. It is possible, with the semiconductor memory device of the present embodiment, to reduce the leak current while properly holding data stored in memory cells by decreasing the memory cell power supply voltage VDDM from the power supply voltage VDD to VTP, as will be described below referring to FIG. 2.

The memory cell 100 shown in FIG. 2 includes a latch circuit formed by the P-type MOS transistors QP1 and QP2 and the N-type MOS transistors QN3 and QN4. The latch circuit stores data. The data can be properly held as long as the latch circuit is operating properly. The latch circuit can operate properly as long as one of the P-type MOS transistors QP1 and QP2 is on while one of the N-type MOS transistors QN3 and QN4 is on. Therefore, the voltage supplied to these MOS transistors can be decreased to the lowest possible voltage with which the latch circuit can operate properly (hereinafter referred to as the "memory cell holding voltage").

Where the two P-type MOS transistors QP1 and QP2 included in the memory cell 100 are of the same size and the two N-type MOS transistors QN3 and QN4 included therein are of the same size, either the absolute value of the threshold voltage VTP of the P-type MOS transistors QP1 and QP2 or the threshold voltage of the N-type MOS transistors QN3 and QN4 (hereinafter referred to as "VTN"), whichever is higher, is the memory cell holding voltage. The latch circuit formed by these transistors can operate properly as long as the higher of VTP and VTN is supplied to the memory cell 100 as the memory cell power supply voltage VDDM. With the semiconductor memory device of the present embodiment, it is assumed that the absolute value of VTP is greater than VTN. Therefore, the semiconductor memory device of the present embodiment can properly hold data stored therein with the memory cell power supply voltage VDDM being equal to VTP.

The leak current increases/decreases depending on the memory cell power supply voltage supplied to the memory cell. Therefore, the semiconductor memory device of the present embodiment can reduce the leak current by decreasing the memory cell power supply voltage from its normal value (the power supply voltage VDD) to VTP.

An experiment with a semiconductor memory device of a 130-nm process showed that where the threshold voltage VTN of the N-type MOS transistors is 0.30 V and the threshold voltage VTP of the P-type MOS transistors is 0.32 V, data stored in the memory cells can be properly held if the memory cell power supply voltage is at least about 0.30 V.

As described above, in the semiconductor memory device of the present embodiment, the memory cell power supply voltage supplied to memory cells connected to an inactive word line is decreased to the threshold voltage VTP of the transistors, thereby reducing the amount of power to be consumed as the leak current of the memory cells. Thus, it is possible to reduce the power consumption of the semiconductor memory device. The semiconductor memory device of the present embodiment has desirable operating characteristics at low power supply voltages because the threshold voltage of the transistors is not increased by the substrate bias effect, as is in a conventional semiconductor memory device.

A leak current also affects the operating speed of a semiconductor memory device. Particularly, a leak current flowing out of a memory cell and a leak current flowing into a memory cell affect the read/write operation from/to the memory cell. Therefore, by reducing the leak current flowing from the memory cell to the bit line and the leak current flowing from the bit line to the memory cell, it is possible to increase the operating speed of the semiconductor memory device.

For example, when reading H-level data from the memory cell 100 of FIG. 2 (where the H level is stored at the node N1 and the L level at the node N2), a leak current from another memory cell connected to the same bit line as the memory cell 100 and storing L-level data therein (where the L level is stored at the node N1 and the H level at the node N2) can affect the read operation from the memory cell 100 to slow down the read operation. Similarly, when writing H-level data to the memory cell 100, a leak current from another memory cell connected to the same bit line as the memory cell 100 and storing L-level data therein can affect the write operation to the memory cell 100 to slow down the write operation.

In the semiconductor memory device of the present embodiment, the memory cell power supply voltage supplied to memory cells connected to an inactive word line is decreased to the threshold voltage VTP of the transistors, thereby reducing the leak current flowing out from inactive memory cells to the bit line. Therefore, it is possible to suppress the leak current affecting the read/write operation from/to memory cells. Thus, with the semiconductor memory device of the present embodiment, it is possible to increase the reading/writing speed.

Figure 4:
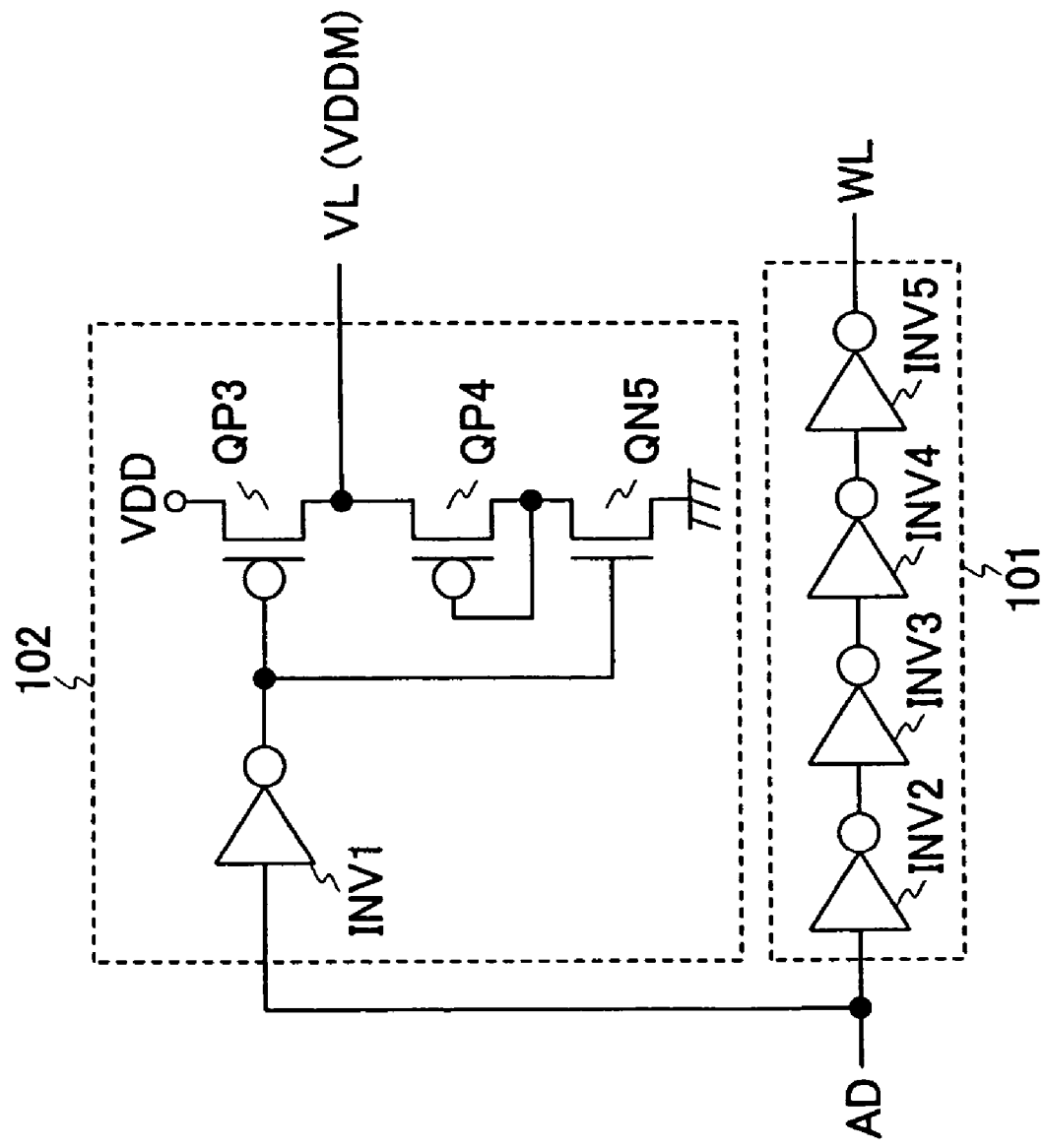
FIG. 4 shows a configuration of a word line driver circuit provided in the semiconductor memory device according to the first embodiment of the present invention.

In order for a semiconductor memory device to perform a read/write operation at a high speed, it is necessary that the memory cell power supply voltage VDDM transitions from the memory holding voltage VTP to the power supply voltage VDD before the memory cell 100 becomes active. In the semiconductor memory device of the present embodiment, the external addressing signal AD is delayed by using the word line driver circuit 101, whereby the memory cell power supply voltage VDDM transitions from the memory holding voltage VTP to the power supply voltage VDD before the memory cell 100 becomes active. Referring now to FIG. 4, how the addressing signal AD is delayed will be described.

FIG. 4 shows a configuration of the word line driver circuit 101 and the memory cell power supply voltage control circuit 102. The word line driver circuit 101 includes inverters INV2 to INV5. As shown in FIG. 4, in the memory cell power supply voltage control circuit 102, the number of gates from the input to the output is two, whereas in the word line driver circuit 101, the number of gates from the input to the output is four. Therefore, if the addressing signal AD is inputted simultaneously to the word line driver circuit 101 and to the memory cell power supply voltage control circuit 102, the signal outputted from the word line driver circuit 101 is delayed with respect to the signal outputted from the memory cell power supply voltage control circuit 102 due to the difference in the number of gates.

As described above, in the semiconductor memory device of the present embodiment, the addressing signal AD is delayed by using the word line driver circuit 101 so as to ensure that the memory cell is activated after the transition of the memory cell power supply voltage to the power supply voltage VDD. Thus, it is possible to increase the speed of the read/write operation from/to the memory cell.

In recently-developed semiconductor memory devices, the absolute value of the threshold voltage of transistors included in the memory cell array may be set to be higher than the threshold voltage of transistors included in peripheral circuits other than the memory cell array. This is to reduce the transistor leak current, which increases as the process rule becomes finer, and to thereby suppress the power consumption of the semiconductor memory device. Particularly, in a semiconductor memory device having large-capacity memory cell arrays, the power consumption of the memory cell arrays accounts for a large portion of the total power consumption of the entire semiconductor memory device. Therefore, by setting the absolute value of the threshold voltage of the transistors included in the memory cell arrays to be higher than the threshold voltage of the transistors included in the peripheral circuits, it is possible to reduce the power consumption of the semiconductor memory device.

In the semiconductor memory device of the present embodiment, the memory cell holding voltage is controlled by the memory cell power supply voltage control circuit to be equal to the absolute value of the threshold voltage VTP of the transistors included in the memory cell. In the memory cell power supply voltage control circuit 102 shown in FIG. 3, the memory cell holding voltage is controlled by the P-type MOS transistor QP4 connected in a diode-type gate connection. Therefore, even when the transistors included in the memory cell arrays have characteristics different from those of the transistors included in the peripheral circuits other than the memory cell arrays, the memory cell power supply voltage control circuit can always supply an optimal memory cell holding voltage to the memory cell array if the characteristics of the P-type MOS transistor QP4 are matched with those of the transistors included in the memory cell array.

Note that if VTN is greater than the absolute value of VTP, the memory cell holding voltage will be VTN. In such a case, the P-type MOS transistor QP4 included in the memory cell power supply voltage control circuit 102 can be replaced with an N-type MOS transistor having a threshold voltage of VTN.

Second Embodiment

Figure 5:
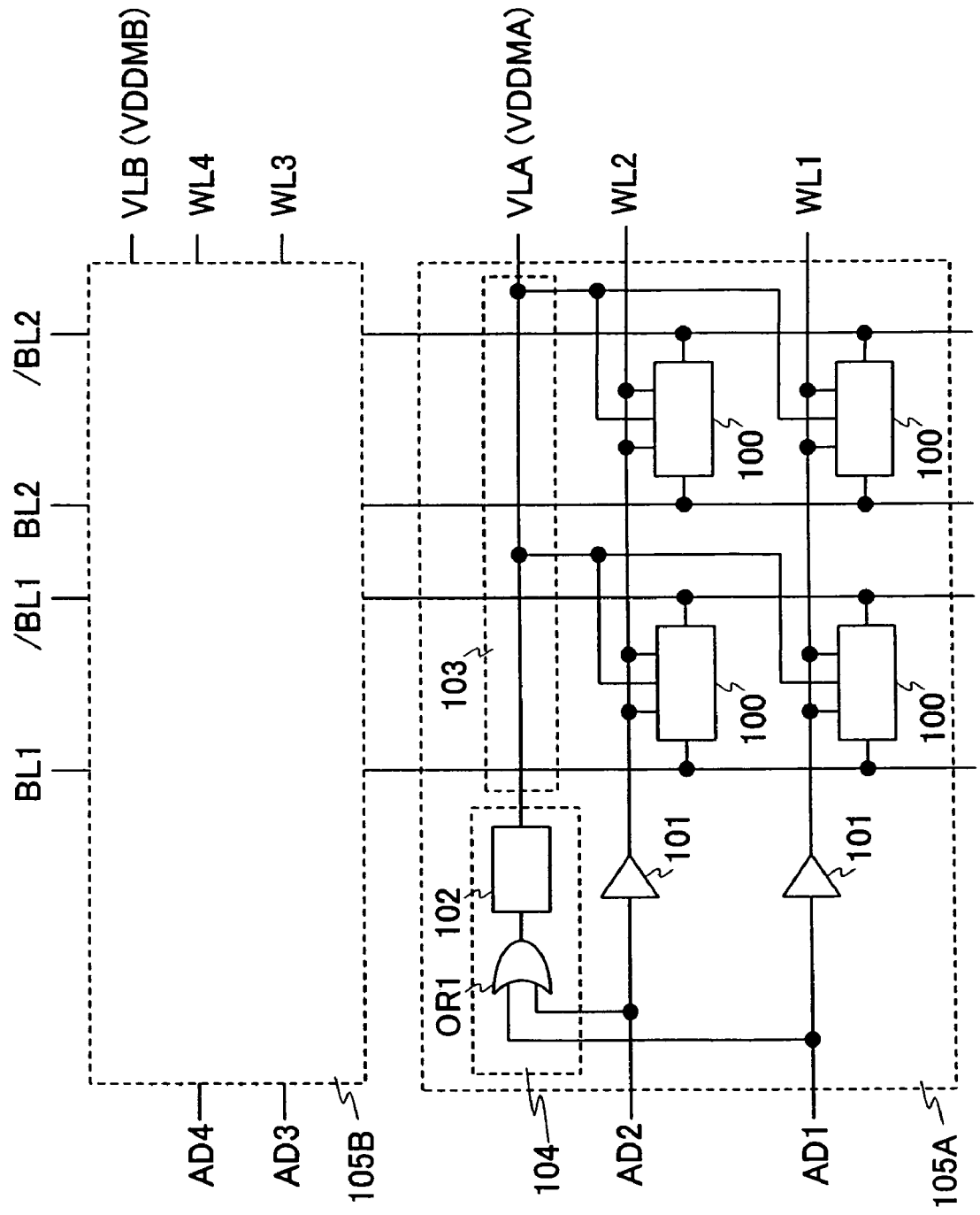
FIG. 5 shows a configuration of a semiconductor memory device according to a second embodiment of the present invention.

FIG. 5 shows a configuration of a semiconductor memory device according to a second embodiment of the present invention. The semiconductor memory device shown in FIG. 5 includes a memory cell array 105A and a memory cell array 105B. The memory cell array 105A includes the memory cells 100, the word line driver circuit 101, the memory cell power supply voltage control circuit 102, an OR circuit OR1, the word lines WL1 and WL2, and a power supply line VLA. The elements of the memory cell array 105B are the same as those of the memory cell array 105A except for word lines WL3 and WL4 and a power supply line VLB, and therefore the configuration of the memory cell array 105B is not shown in detail in FIG. 5. The memory cell 100, the word line driver circuit 101 and the memory cell power supply voltage control circuit 102 are as described above in the first embodiment, and will not be further described below.

There are two differences as follows between the memory cell array 105A included in the semiconductor memory device of the present embodiment shown in FIG. 5 and the semiconductor memory device of the first embodiment shown in FIG. 1. In the memory cell array 105A, the OR circuit OR1 receiving the addressing signals AD1 and AD2 as its inputs is provided preceding the memory cell power supply voltage control circuit 102. Moreover, in the memory cell array 105A, the same memory cell power supply voltage VDDMA is supplied from the memory cell power supply voltage control circuit 102 to all the memory cells 100 connected to the word lines WL1 and WL2. The memory cell array 105B included in the semiconductor memory device of the present embodiment shown in FIG. 5 similarly differs from the semiconductor memory device of the first embodiment shown in FIG. 1.

An operation of the semiconductor memory device of the present embodiment having such a configuration will now be described. First, the OR circuit OR1 included in the memory cell array 105A outputs the logical sum of the addressing signals AD1 and AD2. The memory cell power supply voltage VDDMA is controlled based on the signal outputted from the OR circuit OR1. For example, if either one of the addressing signals AD1 and AD2 is at the H level, the OR circuit OR1 outputs an H-level signal, whereby the memory cell power supply voltage VDDMA outputted from the memory cell power supply voltage control circuit 102 will be equal to the power supply voltage VDD. If the addressing signals AD1 and AD2 are both at the L level, the OR circuit OR1 outputs an L-level signal, whereby the memory cell power supply voltage VDDMA outputted from the memory cell power supply voltage control circuit 102 will be equal to the memory holding voltage VTP.

Figure 6:
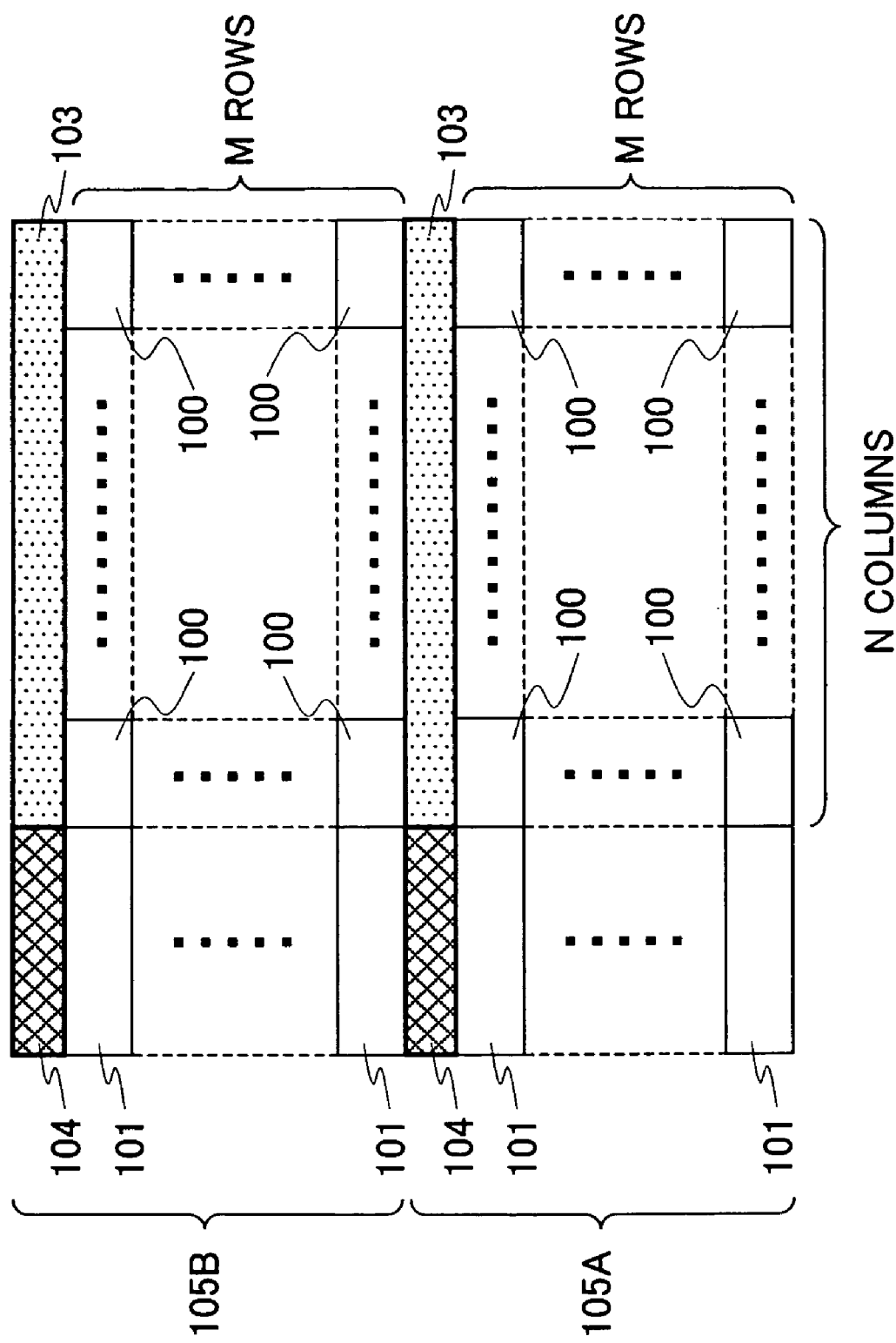
FIG. 6 shows a layout of the semiconductor memory device according to the second embodiment of the present invention.

FIG. 6 shows an exemplary layout of the memory cell array 105A (or 105B) having such a configuration in an actual semiconductor memory device. Memory cell arrays of a semiconductor memory device typically include regions for supplying the substrate potential to P-type MOS transistors and N-type MOS transistors included in the memory cells (hereinafter referred to as "substrate potential supplying regions") arranged at regular intervals. In FIG. 6, a substrate potential supplying region 103 is provided for every m rows of the memory cells 100. Moreover, a memory cell array typically includes a blank area 104 with no circuits present therein. The blank area 104 is adjacent to the substrate potential supplying region 103, and is interposed between word line driver circuit regions occupied by the word line driver circuits 101.

The OR circuit OR1 and the memory cell power supply voltage control circuit 102 shown in FIG. 5 can be provided in the blank area 104, while the power supply line VLA (or VLB) shown in FIG. 5 can be provided in the substrate potential supplying region 103. Therefore, the OR circuit OR1 and the memory cell power supply voltage control circuit 102 can be provided without increasing the total area of the semiconductor memory device.

As described above, the semiconductor memory device of the present embodiment includes an OR circuit for obtaining the logical sum of addressing signals supplied from a plurality of word lines, and controls memory cells connected to different word lines with a single memory cell power supply voltage control circuit. Thus, it is possible to realize similar effects to those of the semiconductor memory device of the first embodiment while suppressing an increase in the area of the semiconductor memory device.

Third Embodiment

Figure 7:
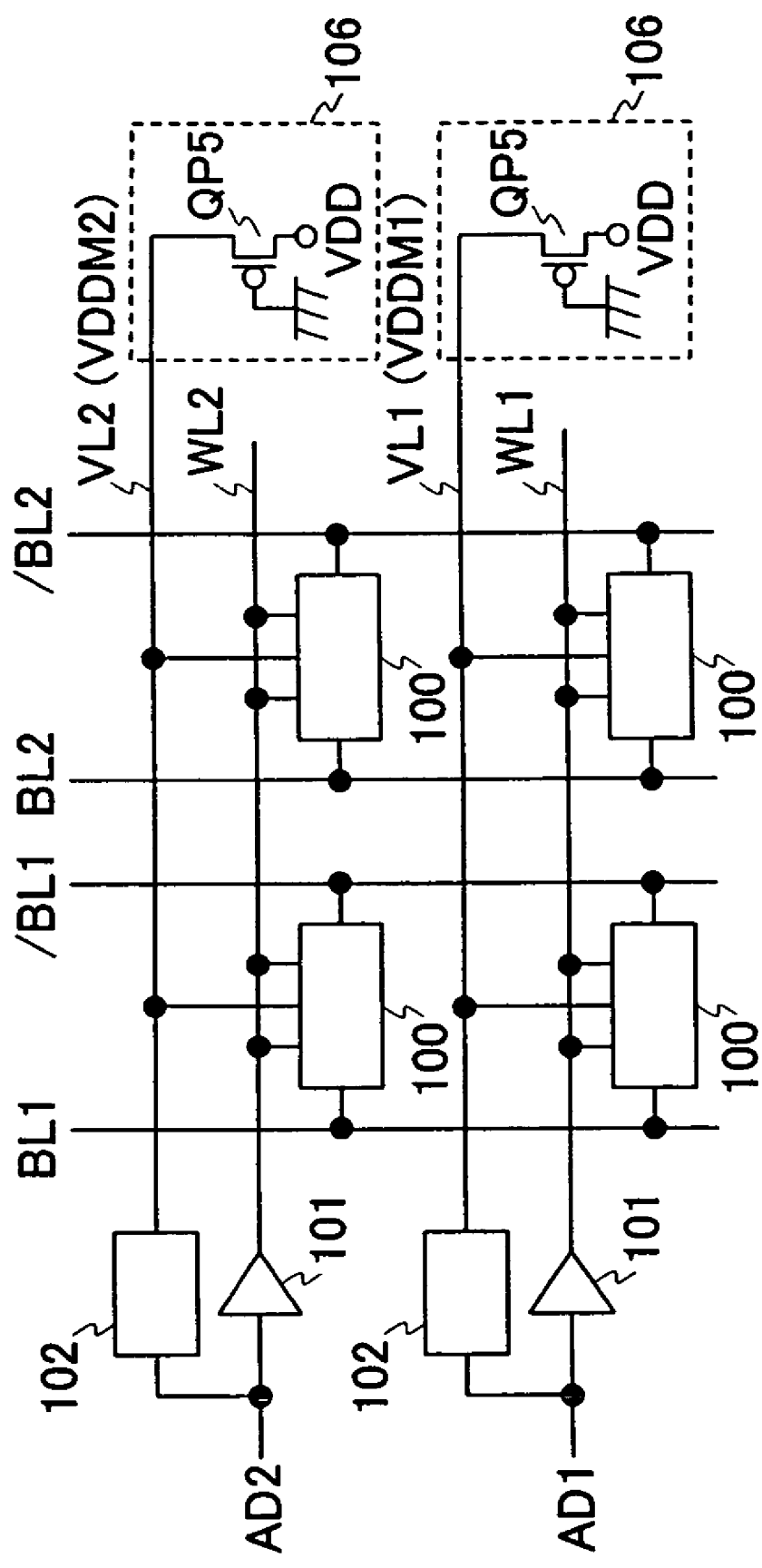
FIG. 7 shows a configuration of a semiconductor memory device according to a third embodiment of the present invention.

Referring to FIG. 7, a semiconductor memory device according to a third embodiment of the present invention is obtained by adding a memory cell power supply voltage compensation circuit 106 to the semiconductor memory device of the first embodiment. Therefore, a configuration and an operation of the memory cell power supply voltage compensation circuit 106 will be described below.

The memory cell power supply voltage compensation circuit 106 includes a P-type MOS transistor QP5. The source electrode of the P-type MOS transistor QP5 is connected to the power supply terminal VDD, the drain electrode thereof is connected to the power supply line VL1 (or VL2) for supplying the memory cell power supply voltage VDDM1 (or VDDM2), and the gate electrode thereof is grounded. The memory cell power supply voltage compensation circuit 106 supplies a charge from the P-type MOS transistor QP5 to the power supply line VL1 (or VL2) irrespective of the state of the word line WL1 (or WL2). Referring now to FIG. 7, an operation of the memory cell power supply voltage compensation circuit 106 connected to the power supply line VL1 will be described.

First, assume a case where an H-level addressing signal AD1 is inputted to activate the word line WL1. Then, the memory cell power supply voltage VDDM1 is equal to the power supply voltage VDD, and therefore the power supply voltage VDD will be supplied to the memory cells 100 connected to the word line WL1. The power supply voltage VDD is also supplied to the drain electrode of the P-type MOS transistor QP5. Therefore, there is no potential difference between the source and the drain of the P-type MOS transistor QP5, whereby no current flows through the P-type MOS transistor QP5. In such a case, no charge is supplied from the memory cell power supply voltage compensation circuit 106 to the power supply line VL1.

Next, assume a case where the addressing signal AD1 transitions to the L level to inactivate the word line WL1. Then, the memory cell power supply voltage VDDM1 is equal to the memory cell holding voltage VTP, and therefore the memory cell holding voltage VTP will be supplied to the memory cells 100 connected to the word line WL1. Moreover, the memory cell holding voltage VTP is also supplied to the drain electrode of the P-type MOS transistor QP5. Since the memory cell holding voltage VTP is lower than the power supply voltage VDD, there is a potential difference between the source and the drain of the P-type MOS transistor QP5, whereby a current flows through the P-type MOS transistor QP5. Thus, the memory cell power supply voltage compensation circuit 106 supplies a charge to the power supply line VL1.

As described above in the first embodiment, the memory cells 100 have a leak current. Therefore, a voltage drop occurs in the memory cell power supply voltage VDDM1 supplied to the memory cells 100. Therefore, the memory cell power supply voltage compensation circuit 106 is provided so that the amount of charge supplied from the memory cell power supply voltage compensation circuit 106 to the power supply line VL1 is equal to the amount of charge lost due to the leak currents of all the memory cells 100 connected to the power supply line VL1. Thus, the memory cell power supply voltage VDDM1 supplied to the memory cells 100 connected to the word line WL1 being inactive is kept at the memory cell holding voltage VTP.

As described above, in the semiconductor memory device of the present embodiment, the amount of charge lost due to the leak currents of the memory cells 100 is compensated for by the memory cell power supply voltage compensation circuit 106. Therefore, it is possible to supply a stable memory cell holding voltage to the memory cells 100 connected to an inactive word line.

While a P-type MOS transistor is used as an element of the memory cell power supply voltage compensation circuit 106 in the present embodiment, an N-type MOS transistor, a resistive element, or the like, may be used instead of a P-type MOS transistor as long as the element is capable of compensating for the amount of charge lost due to leak currents.

While the amount of charge lost due to leak currents is compensated for by the memory cell power supply voltage compensation circuit 106 in the present embodiment, the P-type MOS transistor QP3 included in the memory cell power supply voltage control circuit 102 also has a function of supplying a charge to the memory cells 100. Therefore, the memory cell power supply voltage compensation circuit 106 may be designed taking into consideration the charge-supplying capacity of the P-type MOS transistor QP3. Thus, it is possible to reduce the amount of charge to be compensated for by the memory cell power supply voltage compensation circuit 106. Particularly, if the P-type MOS transistor QP3 has a sufficient charge-supplying capacity for compensating for the amount of charge lost due to leak currents of the memory cells, the memory cell power supply voltage compensation circuit 106 may be omitted. If the memory cell power supply voltage compensation circuit 106 can be omitted, the circuit area can be reduced.

Fourth Embodiment

Figure 8:
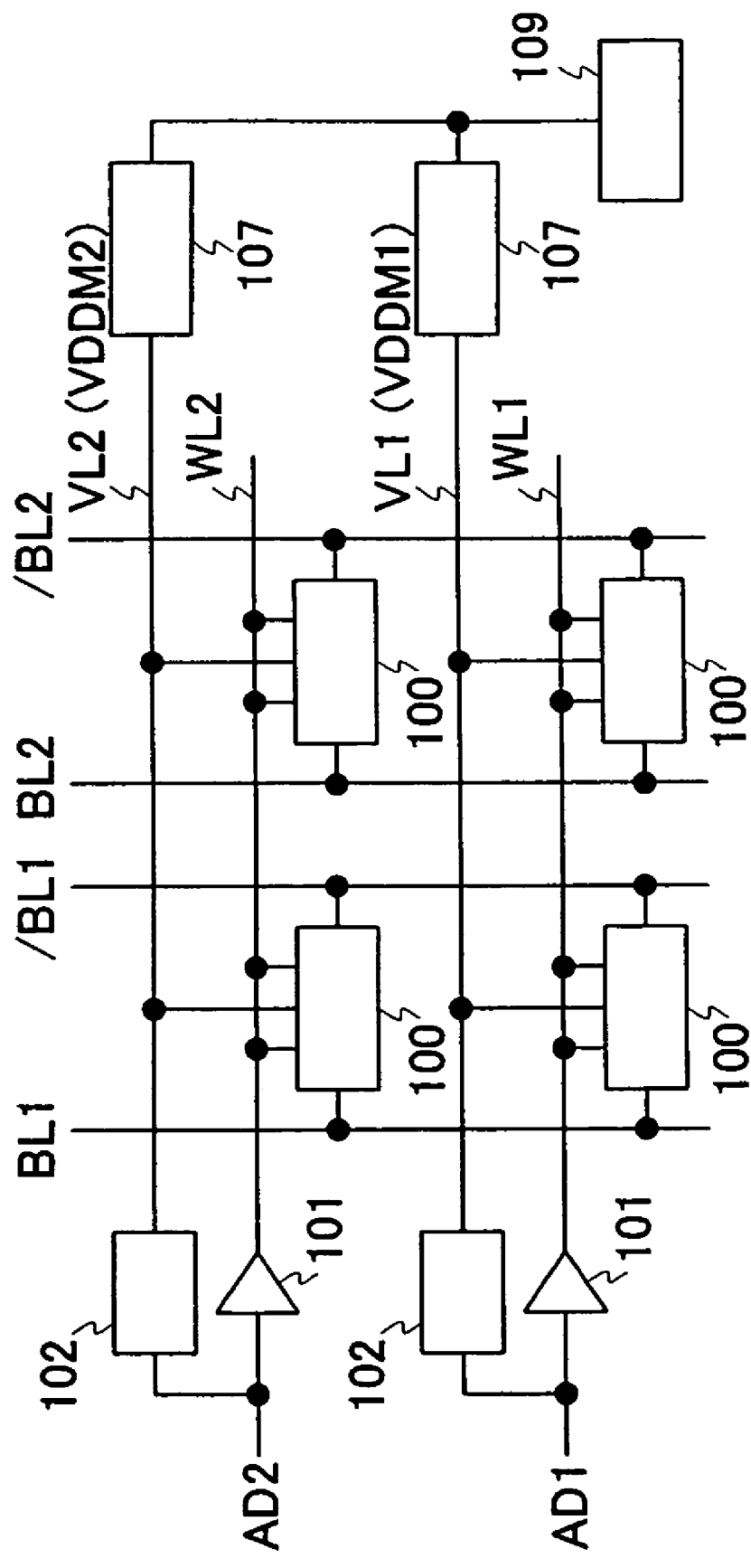
FIG. 8 shows a configuration of a semiconductor memory device according to a fourth embodiment of the present invention.

Referring to FIG. 8, a semiconductor memory device according to a fourth embodiment of the present invention is obtained by adding memory cell power supply voltage compensation circuits 107 and a memory cell holding reference voltage generation circuit 109 to the semiconductor memory device of the first embodiment. Therefore, a configuration and an operation of the memory cell power supply voltage compensation circuit 107 and the memory cell holding reference voltage generation circuit 109 will be described below.

Referring to FIG. 8, one end of the memory cell power supply voltage compensation circuit 107 is connected to the power supply line VL1 (or VL2), with the other end being connected to the output of the memory cell holding reference voltage generation circuit 109.

Figure 9:
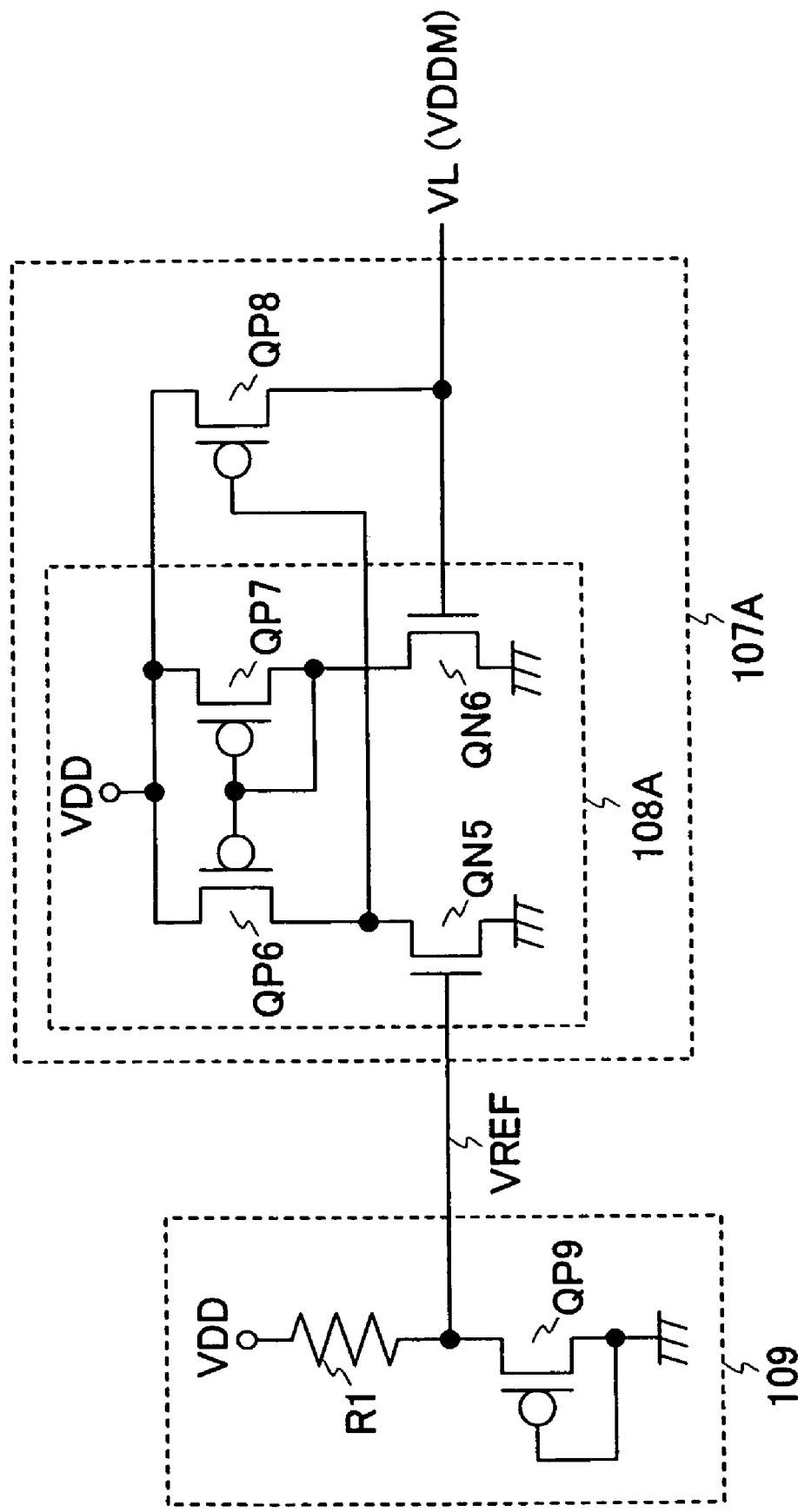
FIG. 9 shows a configuration of a memory cell power supply voltage compensation circuit and a memory cell holding reference voltage generation circuit provided in the semiconductor memory device according to the fourth embodiment of the present invention.

FIG. 9 shows a configuration of the memory cell power supply voltage compensation circuit 107 (hereinafter referred to as a "memory cell power supply voltage compensation circuit 107A") and the memory cell holding reference voltage generation circuit 109. The memory cell power supply voltage compensation circuit 107A shown in FIG. 9 includes P-type MOS transistors QP6 to QP8 and N-type MOS transistors QN5 and QN6.

The source electrodes of the P-type MOS transistors QP6 and QP7 are both connected to the power supply terminal VDD, and the drain electrodes thereof are connected to the drain electrodes of the N-type MOS transistors QN5 and QN6, respectively. The gate electrodes of the P-type MOS transistors QP6 and QP7 are both connected to the drain electrode of the P-type MOS transistor QP7. The source electrodes of the N-type MOS transistors QN5 and QN6 are both grounded, the gate electrodes thereof are connected to the output of the memory cell holding reference voltage generation circuit 109 and to the power supply line VL, respectively.

The P-type MOS transistors QP6 and QP7 and the N-type MOS transistors QN5 and QN6 together form a differential amplifier circuit 108A. The output of the differential amplifier circuit 108A is connected to the gate electrode of the P-type MOS transistor QP8. The source electrode of the P-type MOS transistor QP8 is connected to the power supply terminal VDD, and the drain electrode thereof is connected to the power supply line VL.

The memory cell holding reference voltage generation circuit 109 is connected to the memory cell power supply voltage compensation circuit 107A. The memory cell holding reference voltage generation circuit 109 includes a P-type MOS transistor QP9 connected in a diode-type gate connection, and a resistive element R1. The memory holding reference voltage VREF is outputted from the output of the memory cell holding reference voltage generation circuit 109 (i.e., the connecting point between the P-type MOS transistor QP9 and the resistor R1). Since the P-type MOS transistor QP9 has the same characteristics as those of the P-type MOS transistors included in the memory cells, the memory holding reference voltage VREF outputted from the memory cell holding reference voltage generation circuit 109 is equal to the memory holding voltage VTP.

Referring now to FIG. 9, an operation of the memory cell power supply voltage compensation circuit 107A will be described. When the memory cell power supply voltage VDDM is supplied to the memory cell power supply voltage compensation circuit 107A, the differential amplifier circuit 108A compares the memory cell power supply voltage VDDM with a memory cell holding reference voltage VREF, and amplifies the comparison result to output the amplified comparison result to the gate electrode of the P-type MOS transistor QP8. If the memory cell power supply voltage VDDM is lower than the memory cell holding reference voltage VREF, the differential amplifier circuit 108A outputs an L-level signal to the gate electrode of the P-type MOS transistor QP8. If the memory cell power supply voltage VDDM is higher than the memory cell holding reference voltage VREF, the differential amplifier circuit 108A outputs an H-level signal to the gate electrode of the P-type MOS transistor QP8.

If an L-level signal is inputted to the gate electrode of the P-type MOS transistor QP8 from the differential amplifier circuit 108A, the P-type MOS transistor QP8 is turned on and a charge is supplied from the power supply terminal VDD to the power supply line VL. Therefore, the memory cell power supply voltage VDDM increases. If an H-level signal is inputted to the gate electrode of the P-type MOS transistor QP8 from the differential amplifier circuit 108A, the P-type MOS transistor QP8 is turned off and the memory cell power supply voltage VDDM remains unaffected.

If the memory cell power supply voltage VDDM is lower than the memory cell holding reference voltage VREF, the memory cell power supply voltage VDDM is increased by the differential amplifier circuit 108A to be equal to the memory cell holding reference voltage VREF. When the memory cell power supply voltage VDDM is increased to be equal to the memory cell holding reference voltage VREF, the P-type MOS transistor QP8 is turned off and the memory cell power supply voltage VDDM stops increasing. Thus, when the memory cell power supply voltage VDDM drops, the memory cell power supply voltage compensation circuit 107A increases the memory cell power supply voltage VDDM through the function of the differential amplifier circuit 108A and the P-type MOS transistor QP8. Particularly, when the memory cell power supply voltage VDDM is equal to the memory cell holding voltage VTP, the memory cell power supply voltage compensation circuit 107A holds the memory cell power supply voltage at around the memory cell holding reference voltage VREF.

As already described above in the third embodiment, the memory cell power supply voltage VDDM supplied to memory cells connected to an inactive word line may in some cases drop from the memory cell holding voltage VTP due to leak currents. However, the semiconductor memory device of the present embodiment includes the memory cell power supply voltage compensation circuit 107A to thereby compensate for the drop of the memory cell power supply voltage VDDM due to leak currents from inactive memory cells. Thus, it is possible to supply a stable memory cell power supply voltage VDDM to memory cells.

Figure 10:
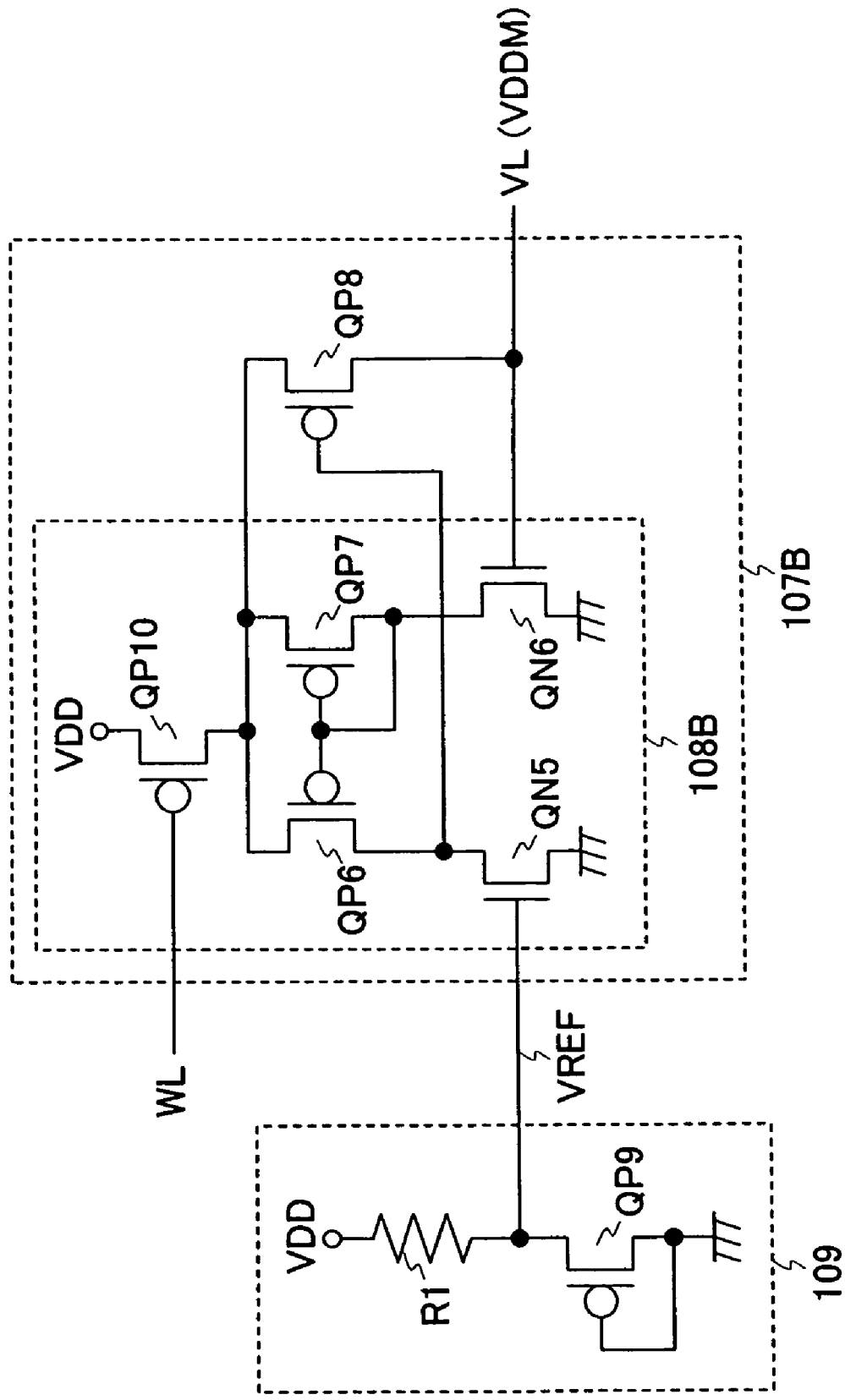
FIG. 10 shows another configuration of a memory cell power supply voltage compensation circuit and a memory cell holding reference voltage generation circuit provided in the semiconductor memory device according to the fourth embodiment of the present invention.

FIG. 10 shows another configuration of the memory cell power supply voltage compensation circuit 107 (hereinafter referred to as a "memory cell power supply voltage compensation circuit 107B"). The memory cell power supply voltage compensation circuit 107B shown in FIG. 10 is obtained by adding a P-type MOS transistor QP10 controlled by the word line WL to the memory cell power supply voltage compensation circuit 107A. The source electrode of the P-type MOS transistor QP10 is connected to the power supply terminal VDD, the drain electrode thereof is connected to the P-type MOS transistors QP6 to QP8, and the gate electrode thereof is connected to the word line WL. Other than this, the configuration is the same as that of the memory cell power supply voltage compensation circuit 107A.

An operation of the memory cell power supply voltage compensation circuit 107B having such a configuration will now be described. If an L-level signal is inputted from the word line WL to the P-type MOS transistor QP10, the P-type MOS transistor QP10 is turned on, and the memory cell power supply voltage compensation circuit 107B performs the same operation as that of the memory cell power supply voltage compensation circuit 107A.

If an H-level signal is inputted from the word line WL to the P-type MOS transistor QP10, the P-type MOS transistor QP10 is turned off, and a differential amplifier circuit 108B and the P-type MOS transistor QP8 will not be activated. Thus, the memory cell power supply voltage compensation circuit 107B is active only when the memory cells are inactive.

As described above, the semiconductor memory device including the memory cell power supply voltage compensation circuit 107B shown in FIG. 10 controls the operation of the differential amplifier circuit 108B with the P-type MOS transistor QP10 so as to activate the differential amplifier circuit 108B only when the memory cells are inactive (where it is necessary to activate the memory cell power supply voltage compensation circuit 107B). Thus, it is possible to minimize the amount of power consumed by the memory cell power supply voltage compensation circuit 107B.

Fifth Embodiment

Figure 11:
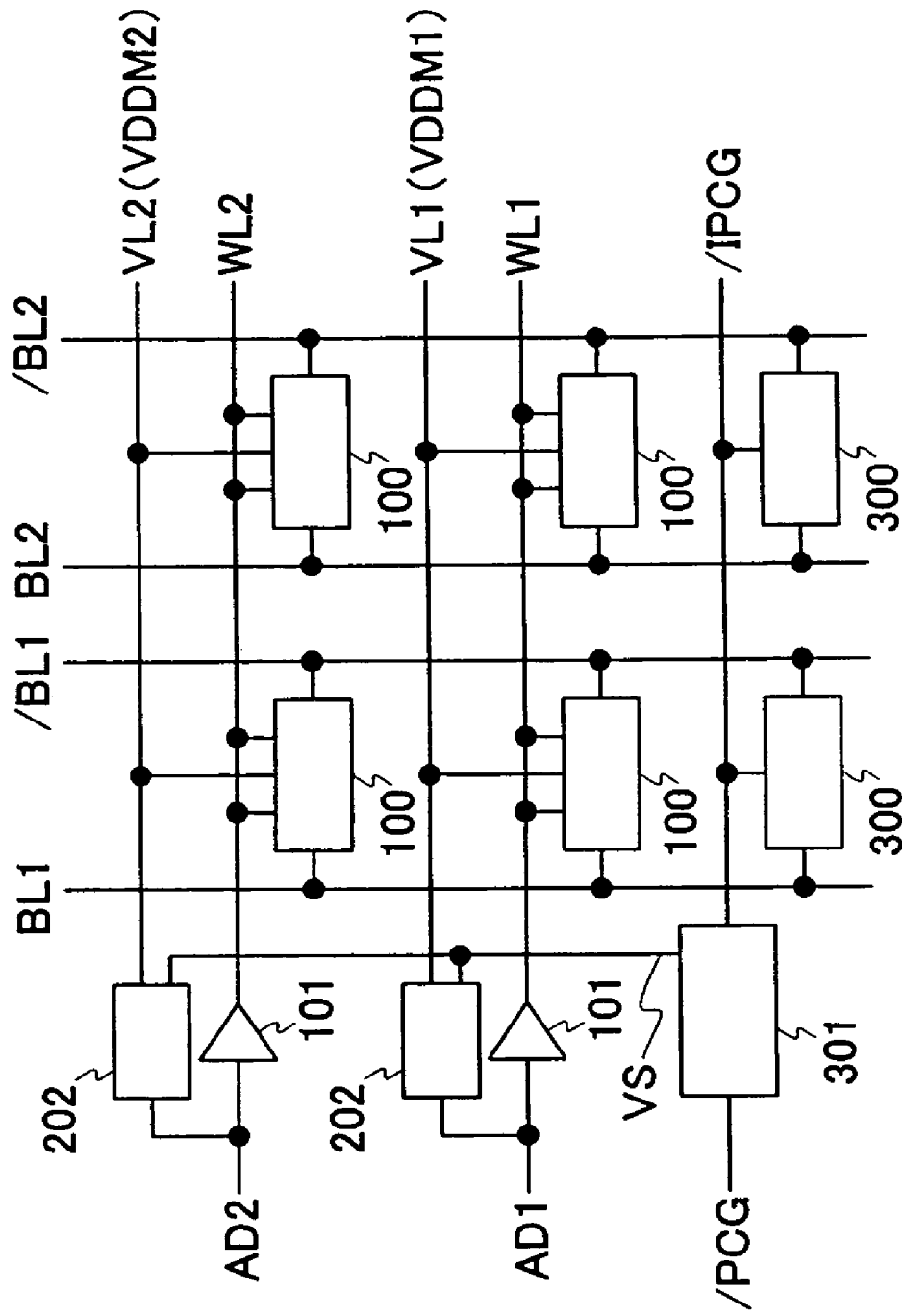
FIG. 11 shows a configuration of a semiconductor memory device according to a fifth embodiment of the present invention.

FIG. 11 shows a configuration of a semiconductor memory device according to a fifth embodiment of the present invention. The semiconductor memory device shown in FIG. 11 includes the memory cells 100, the word line driver circuits 101, memory cell power supply voltage control circuits 202, bit line precharge circuits 300, a bit line precharge control circuit 301, the word lines WL1 and WL2, the bit lines BL1, BL2, /BL1 and /BL2, the power supply lines VL1 and VL2, a bit line precharge control signal line /IPCG, and a memory cell charge supply line VS. The memory cells 100 and the word line driver circuits 101 are as described above in the first embodiment, and will not be further described below.

The bit line precharge circuit 300 is connected to the bit lines BL1 and /BL1 (or BL2 and /BL2) and the bit line precharge control signal line /IPCG. The bit line precharge control circuit 301 is connected to the bit line precharge control signal line /IPCG and the memory cell charge supply line VS. An external bit line precharge signal /PCG is inputted to the bit line precharge control circuit 301. The semiconductor memory device of the present embodiment, including the bit line precharge circuit 300 and the bit line precharge control circuit 301, controls the bit lines BL1, BL2, /BL1 and /BL2 to be at the H level or in a high-impedance state.

Figure 12:
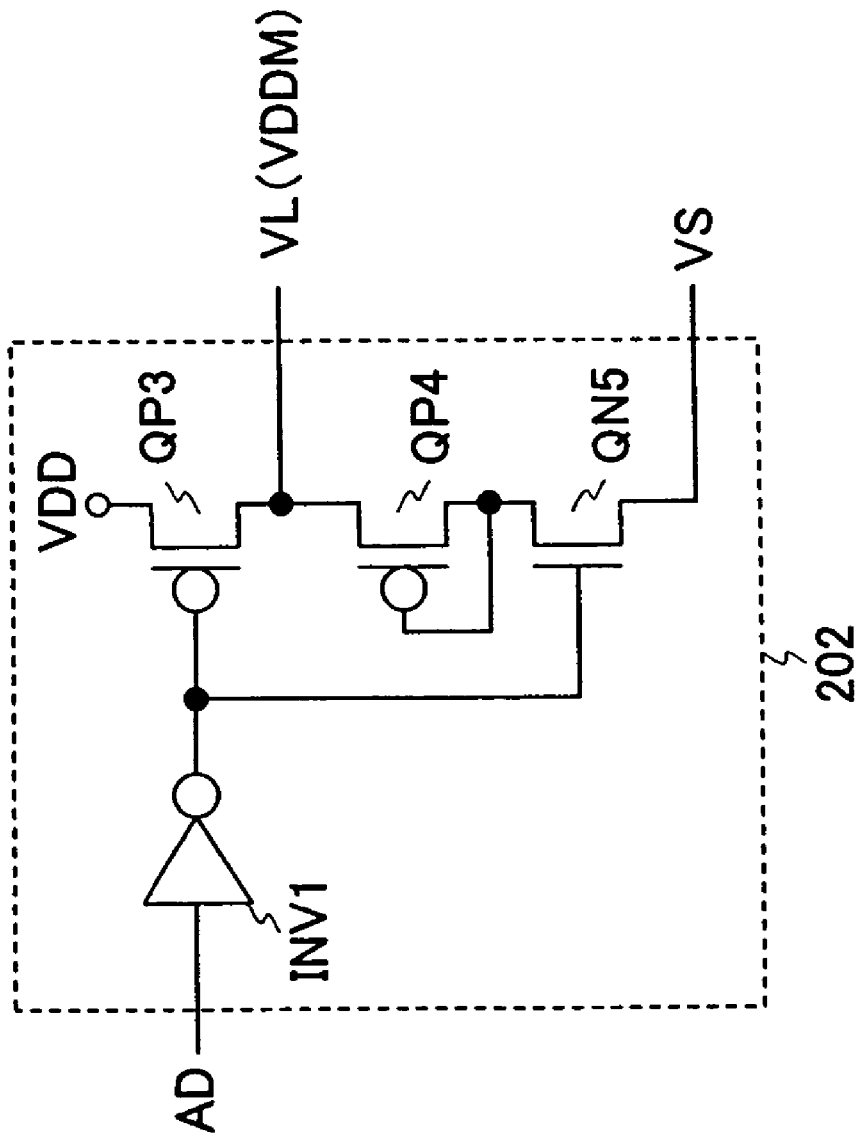
FIG. 12 shows a configuration of a memory cell power supply voltage control circuit provided in the semiconductor memory device according to the fifth embodiment of the present invention.

Referring now to FIG. 12, a configuration of the memory cell power supply voltage control circuit 202 will be described. A difference between the memory cell power supply voltage control circuit 202 and the memory cell power supply voltage control circuit 102 shown in FIG. 3 is as follows. The source electrode of the N-type MOS transistor QN5 included in the memory cell power supply voltage control circuit 202 is connected to the bit line precharge control circuit 301 via the memory cell charge supply line VS. Other than this, the configuration is the same as that of the memory cell power supply voltage control circuit 102, and will not be further described below. Moreover, as does the memory cell power supply voltage control circuit 102, the memory cell power supply voltage control circuit 202 controls the power supply voltage supplied to memory cells based on the state (active or inactive) of the word line connected to the memory cells.

Figure 13:
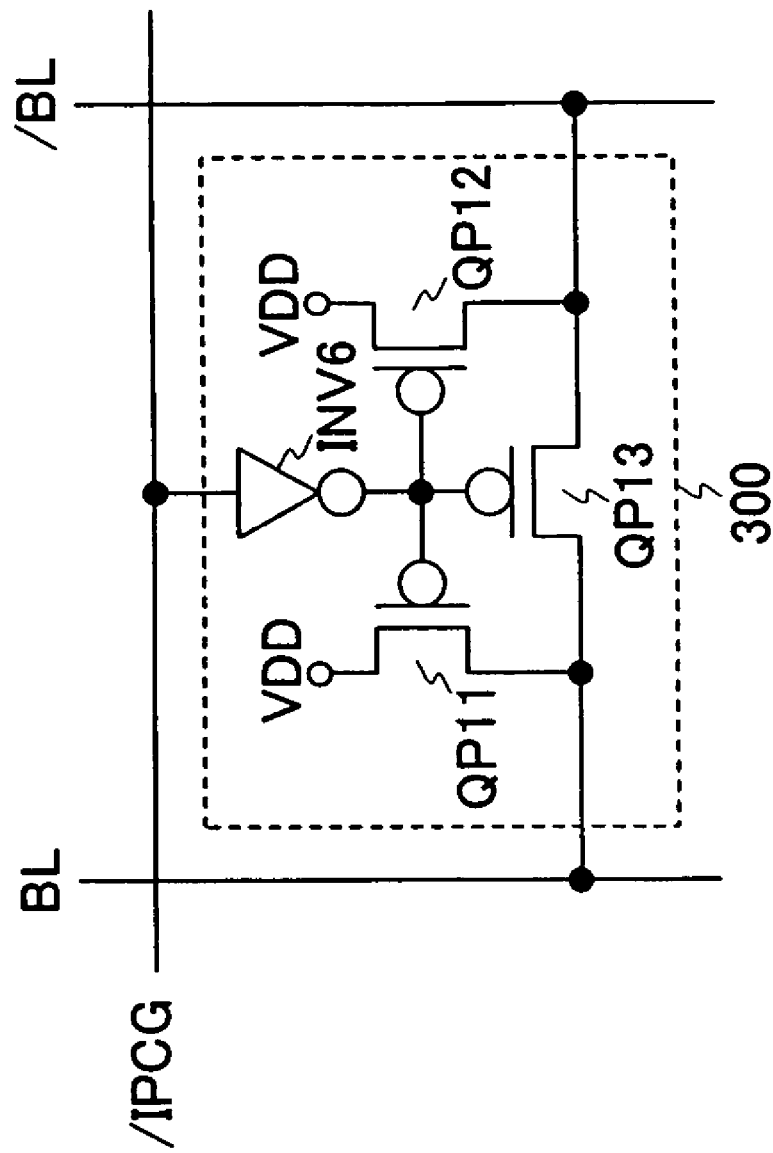
FIG. 13 shows a configuration of a bit line precharge circuit provided in the semiconductor memory device according to the fifth embodiment of the present invention.

Referring now to FIG. 13, a configuration of the bit line precharge circuit 300 will be described. The bit line precharge circuit 300 includes P-type MOS transistors QP11 to QP13 and an inverter INV6. The input of the inverter INV6 is connected to the bit line precharge control signal line /IPCG. The output of the inverter INV6 is connected to the gate electrodes of the P-type MOS transistors QP11 to QP13.

The source electrodes of the P-type MOS transistors QP11 and QP12 are both connected to the power supply terminal VDD. The drain electrodes of the P-type MOS transistors QP11 and QP12 are connected to the bit lines BL and /BL, respectively. The source electrode and the drain electrode of the P-type MOS transistor QP13 are connected to the bit lines BL and /BL, respectively.

An operation of the bit line precharge circuit 300 having such a configuration will now be described. If an H-level signal is inputted from the bit line precharge control signal line /IPCG to the inverter INV6, the gate electrodes of the P-type MOS transistors QP11 to QP13 transition to the L level. As a result, the P-type MOS transistors QP11 to QP13 are turned on, and the bit lines BL and /BL are precharged to the H level.

If an L-level signal is inputted from the bit line precharge control signal line /IPCG to the inverter INV6, the gate electrodes of the P-type MOS transistors QP11 to QP13 transition to the H level. As a result, the P-type MOS transistors QP11 to QP13 are turned off, and the bit lines BL and /BL are brought to a high-impedance state.

Typically, bit line precharge circuits provided in a semiconductor memory device are controlled to be active so as to precharge bit lines to the H level if all the word lines are inactive. If any of the word lines is active, the bit line precharge circuits are controlled to be inactive and the bit lines remain unaffected. Thus, the bit lines are in the high-impedance state. The bit line precharge circuit 300 being controlled by the bit line precharge control circuit 301 performs a similar operation, as will be described below.

Figure 14:
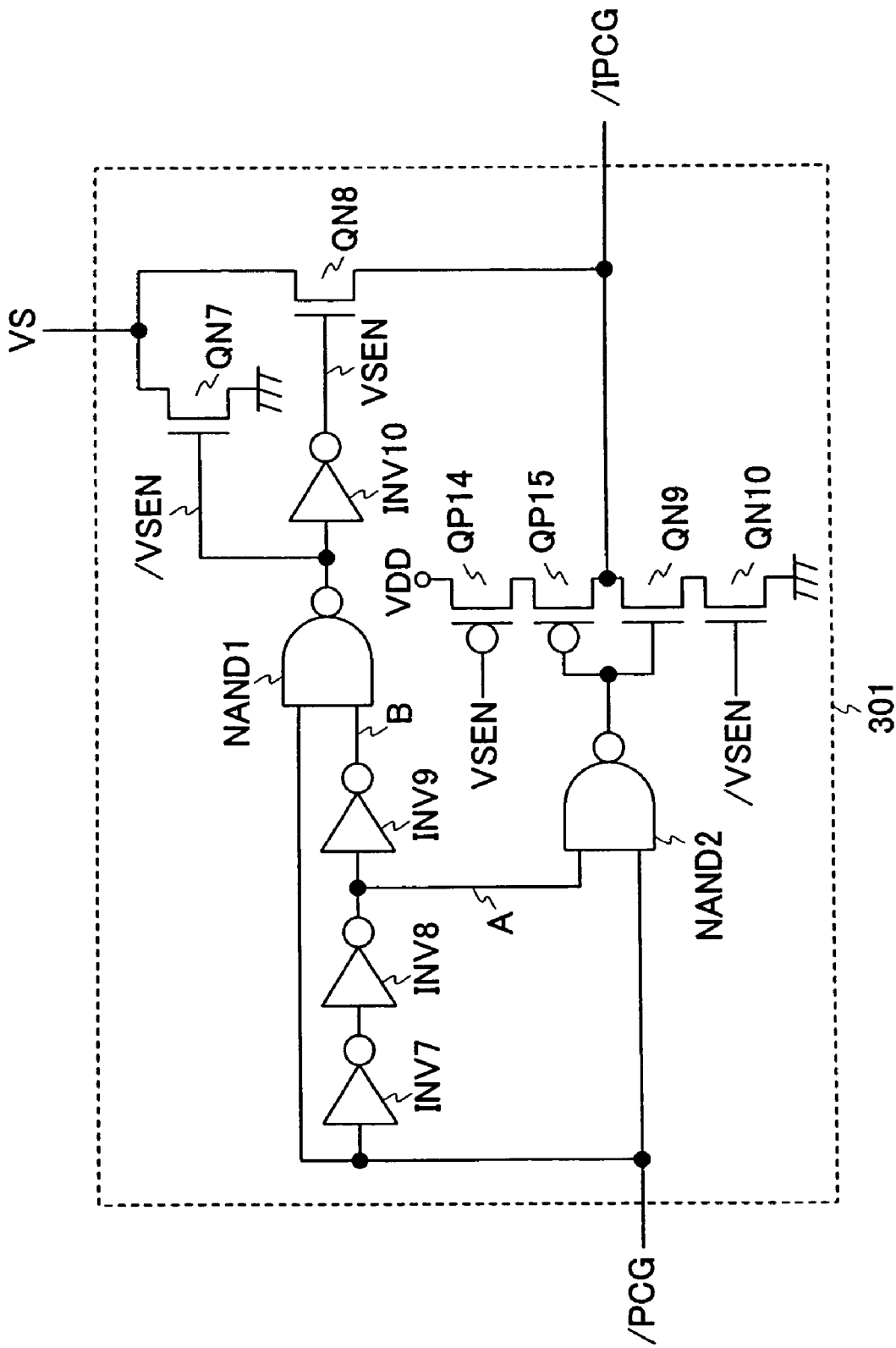
FIG. 14 shows a configuration of a bit line precharge control circuit provided in the semiconductor memory device according to the fifth embodiment of the present invention.

Referring now to FIG. 14, a configuration of the bit line precharge control circuit 301 will be first described. The bit line precharge control circuit 301 includes N-type MOS transistors QN7 to QN10, P-type MOS transistors QP14 and QP15, inverters INV7 to INV10 and NAND circuits NAND1 and NAND2.

The drain electrode of the N-type MOS transistor QN7 is connected to the memory cell charge supply line VS, and the source electrode thereof is grounded. The gate electrode of the N-type MOS transistor QN7 is connected to the output of the NAND circuit NAND1. A node that connects the gate electrode of the N-type MOS transistor QN7 with the output of the NAND circuit NAND1 will be hereinafter referred to as the "node /VSEN". The N-type MOS transistor QN7 connects/disconnects the memory cell charge supply line VS to/from the ground according to a signal outputted from the NAND circuit NAND1.

The drain electrode of the N-type MOS transistor QN8 is connected to the memory cell charge supply line VS, and the source electrode thereof is connected to the bit line precharge control signal line /IPCG. The gate electrode of the N-type MOS transistor QN8 is connected to the output of the inverter INV10. A node that connects the gate electrode of the N-type MOS transistor QN8 with the output of the inverter INV10 will be hereinafter referred to as the "node VSEN". The N-type MOS transistor QN8 connects/disconnects the memory cell charge supply line VS to/from the bit line precharge control signal line /IPCG according to a signal outputted from the inverter INV10.

The n-type MOS transistors QN9 and QN10 and the P-type MOS transistors QP14 and QP15 together form a clock inverter. A configuration of the clock inverter will now be described.

The source electrode of the N-type MOS transistor QN9 is connected to the drain electrode of the N-type MOS transistor QN10, and the drain electrode thereof is connected to the bit line precharge control signal line /IPCG. The gate electrode of the N-type MOS transistor QN9 is connected to the output of the NAND circuit NAND2. The source electrode of the N-type MOS transistor QN10 is grounded, and the gate electrode is connected to the output of the NAND circuit NAND1 via the node /VSEN.

The source electrode of the P-type MOS transistor QP14 is connected to the power supply terminal VDD, and the drain electrode thereof is connected to the source electrode of the P-type MOS transistor QP15. The gate electrode of the P-type MOS transistor QP14 is connected to the output of the inverter INV10 via the node VSEN. The drain electrode of the P-type MOS transistor QP15 is connected to the bit line precharge control signal line /IPCG, and the gate electrode thereof is connected to the output of the NAND circuit NAND2.

The clock inverter having such a configuration controls the bit line precharge control signal line /IPCG to be at the H level, at the L level or in the high-impedance state according to the signal outputted from the NAND circuit NAND2, the signal outputted from the NAND circuit NAND1 and the signal outputted from the inverter INV10.

The inverters INV7 to INV9 and the NAND circuits NAND1 and NAND2 will now be described. The inverters INV7 to INV9 are connected in series. The bit line precharge signal /PCG is inputted to the inverter INV7. One input of the NAND circuit NAND1 is connected to the output of the inverter INV9. A node that connects the inverter INV9 with the NAND circuit NAND1 will be hereinafter referred to as the "node B". The inverters INV7 to INV9 delay a signal that is inputted to the NAND circuit NAND1 via the node B. The bit line precharge signal /PCG is inputted to the other input of the NAND circuit NAND1.

The bit line precharge signal /PCG is inputted to one input of the NAND circuit NAND2. The other input of the NAND circuit NAND2 is connected to the output of the inverter INV8. A node that connects the NAND circuit NAND2 with the inverter INV8 will be hereinafter referred to as the "node A".

An operation of the bit line precharge control circuit 301 having such a configuration will now be described. If an H-level bit line precharge signal /PCG is inputted to the bit line precharge control circuit 301, the NAND circuit NAND1 receives the H-level bit line precharge signal /PCG and an L-level signal via the node B. Thus, the NAND circuit NAND1 outputs an H-level signal to the gate electrode of the N-type MOS transistor QN7 and the inverter INV10. As a result, the N-type MOS transistor QN7 is turned on, whereby the source electrode of the N-type MOS transistor QN5 shown in FIG. 12 is grounded via the memory cell charge supply line VS. Since the inverter INV10 outputs an L-level signal to the gate electrode of the N-type MOS transistor QN8, the N-type MOS transistor QN8 is turned off.

The NAND circuit NAND2 receives the H-level bit line precharge signal /PCG and an H-level signal via the node A. Thus, the NAND circuit NAND2 outputs an L-level signal to the clock inverter. Since an L-level signal is outputted from the inverter INV10 to the node VSEN, the P-type MOS transistor QP14 is turned on. Since an L-level signal is outputted from the NAND circuit NAND2 to the P-type MOS transistor QP15, the P-type MOS transistor QP15 is turned on. Thus, an H-level signal is supplied from the clock inverter to the bit line precharge control signal line /IPCG.

If an L-level bit line precharge signal /PCG is inputted to the bit line precharge control circuit 301, the NAND circuits NAND1 and NAND2 both output an H-level signal. As a result, the N-type MOS transistors QN9 and QN10 are both turned on, and the bit line precharge control signal line /IPCG is grounded. Also in this case, the N-type MOS transistor QN7 is turned on, whereby the source electrode of the N-type MOS transistor QN5 is grounded via the memory cell charge supply line VS.

As described above, the bit line precharge control circuit 301 controls the signal supplied to the bit line precharge control signal line /IPCG to be at the H level if the bit line precharge signal /PCG is at the H level, and controls the signal supplied to the bit line precharge control signal line /IPCG to be at the L level if the bit line precharge signal /PCG is at the L level.

As described above, if an H-level signal is supplied to the bit line precharge control signal line /IPCG, the bit line precharge circuit 300 precharges the bit lines BL and /BL. If an L-level signal is supplied to the bit line precharge control signal line /IPCG, the bit line precharge circuit 300 does nothing to the bit lines BL and /BL. Therefore, the bit lines BL and /BL will be in the high-impedance state.

When all the word lines are inactive, the H-level bit line precharge signal /PCG is inputted to the bit line precharge control circuit 301, whereby the semiconductor memory device of the present embodiment activates all the bit line precharge circuits 300 connected to the bit line precharge control signal line /IPCG, thus precharging all of the bit lines BL1, BL2, /BL1 and /BL2.

When any of the word lines is active, the L-level bit line precharge signal /PCG is inputted to the bit line precharge control circuit 301, whereby the semiconductor memory device of the present embodiment inactivates all the bit line precharge circuits 300 connected to the bit line precharge control signal line /IPCG, thus bringing all of the bit lines BL1, BL2, /BL1 and /BL2 to the high-impedance state.

As described above, the semiconductor memory device of the present embodiment includes the bit line precharge control circuit 301, whereby the bit line precharge circuits 300 are operated in a manner similar to that of ordinary bit line precharge circuits.

Whether the bit line precharge signal /PCG inputted to the bit line precharge control circuit 301 is at the H level or at the L level, the source electrode of the N-type MOS transistor QN5 shown in FIG. 12 is grounded via the memory cell charge supply line VS, whereby the memory cell power supply voltage control circuit 202 operates in a manner similar to that of the memory cell power supply voltage control circuit 102 of the first embodiment. Therefore, as does the semiconductor memory device of the first embodiment, the semiconductor memory device of the present embodiment provides effects such as a reduction in the power consumption of the semiconductor memory device or an increase in the operating speed thereof.

In addition to the effects mentioned above, the semiconductor memory device of the present embodiment supplies the charge stored in the power supply line VL1 (or VL2) to the bit line precharge control signal line /IPCG, thus reusing the charge, thereby further reducing the power consumption of the semiconductor memory device. This effect will now be described with reference to FIG. 14.

For example, referring to FIG. 11, consider a case where the addressing signal AD1 transitions from the H level to the L level and the word line WL1 transitions from the active state to the inactive state. When the word line WL1 transitions to the inactive state, all the memory cells 100 connected to the word line WL1 transition to the inactive state. In such a case, in the semiconductor memory device of the first embodiment, when the memory cell power supply voltage VDDM1 transitions from the power supply voltage VDD to VTP through the control by the memory cell power supply voltage control circuit 102 shown in FIG. 1, the charge stored in the power supply line VL1 is discharged from the source electrode of the N-type MOS transistor QN5 to the ground terminal.

In contrast, in the semiconductor memory device of the present embodiment, when the word line WL1 transitions to the inactive state and the bit line precharge signal /PCG transitions from the L level to the H level, the two inputs of the NAND circuit NAND1 will be at the H level during the delay caused by the inverters INV7 to INV9 provided in the bit line precharge control circuit 301. Therefore, in this time period, an L-level signal is outputted from the NAND circuit NAND1, whereby the N-type MOS transistor QN7 is off and the N-type MOS transistor QN8 is on.

When the N-type MOS transistor QN7 is off and the N-type MOS transistor QN8 is on, the N-type MOS transistor QN5 included in the memory cell power supply voltage control circuit 202 and the bit line precharge control signal line /IPCG are electrically connected to each other. As a result, when the memory cell power supply voltage VDDM1 transitions from the power supply voltage VDD to VTP, the charge stored in the power supply line VL1 is supplied to the bit line precharge control signal line /IPCG via the memory cell charge supply line VS.

Since the node VSEN is at the H level and the node /VSEN is at the L level, the output of the clock inverter is in the high-impedance state and the clock inverter will not affect the bit line precharge control signal line /IPCG.

Figure 15:
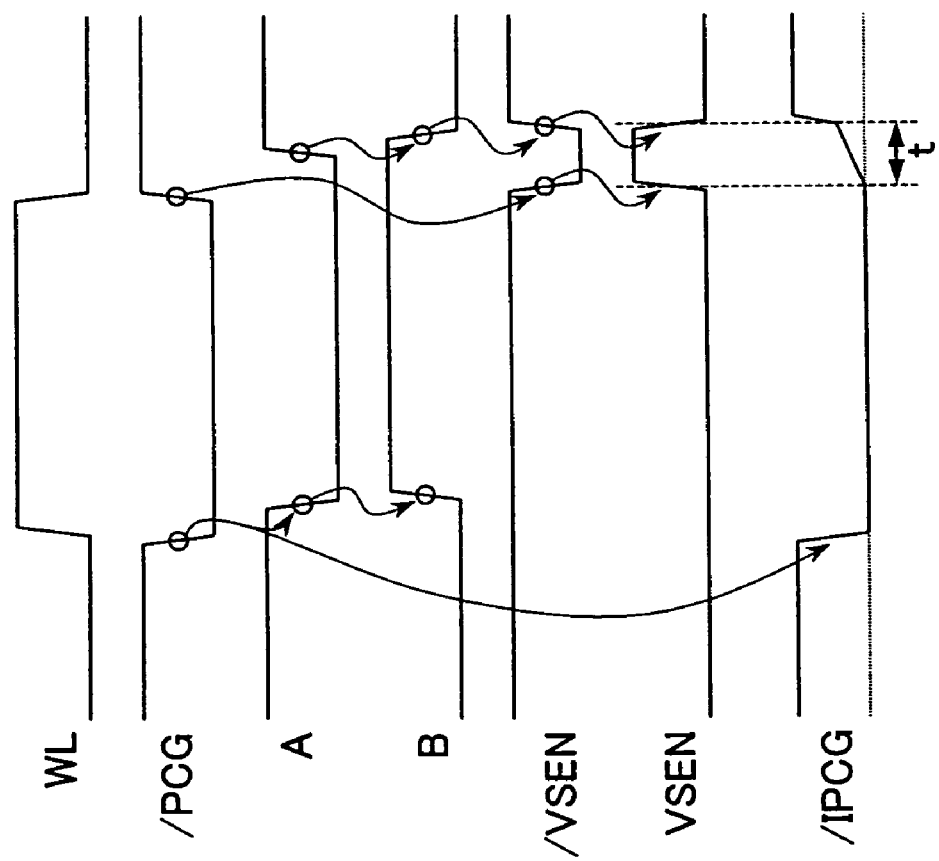
FIG. 15 is a timing diagram showing an operation of the semiconductor memory device according to the fifth embodiment of the present invention.

FIG. 15 shows the operation described above in the form of a timing diagram. FIG. 15 shows that when the word line WL transitions from the H level to the L level and the bit line precharge signal /PCG transitions from the L level to the H level, a charge is supplied to the bit line precharge control signal line /IPCG from the power supply line VL1 and the potential of the bit line precharge control signal line /IPCG is gradually increased by the supplied charge, during the period t after the bit line precharge signal /PCG is inputted until the signal supplied to the node B transitions to the L level (i.e., during the delay caused by the inverters INV7 to INV9).

As described above, in the semiconductor memory device of the present embodiment, when a word line transitions from the active state to the inactive state, the charge stored in the power supply line VL is supplied to the bit line precharge control signal line /IPCG, thus reusing the charge. This further reduces the power consumption of the semiconductor memory device.

Sixth Embodiment

Figure 16:
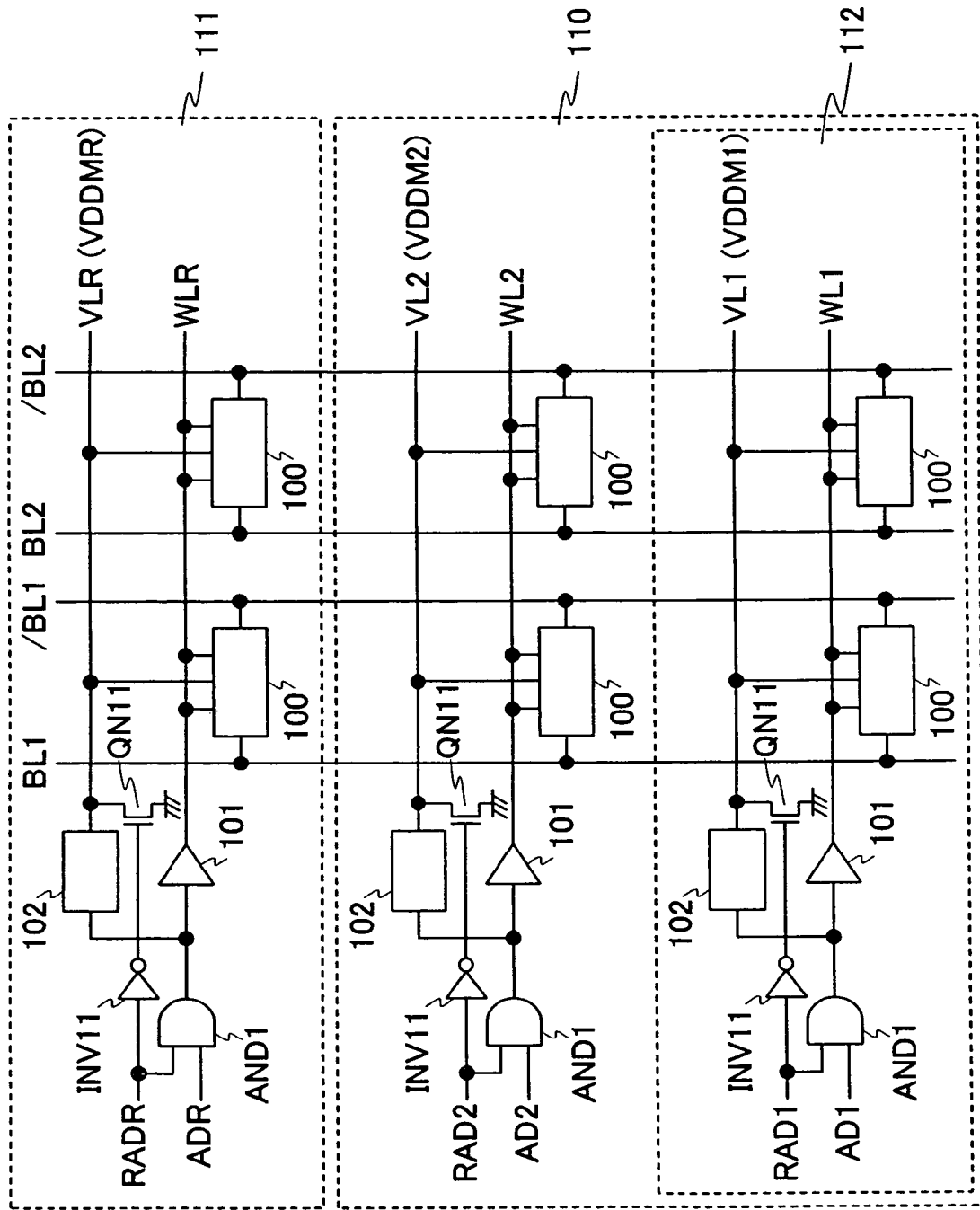
FIG. 16 shows a configuration of a semiconductor memory device according to a sixth embodiment of the present invention.
Figure 17:
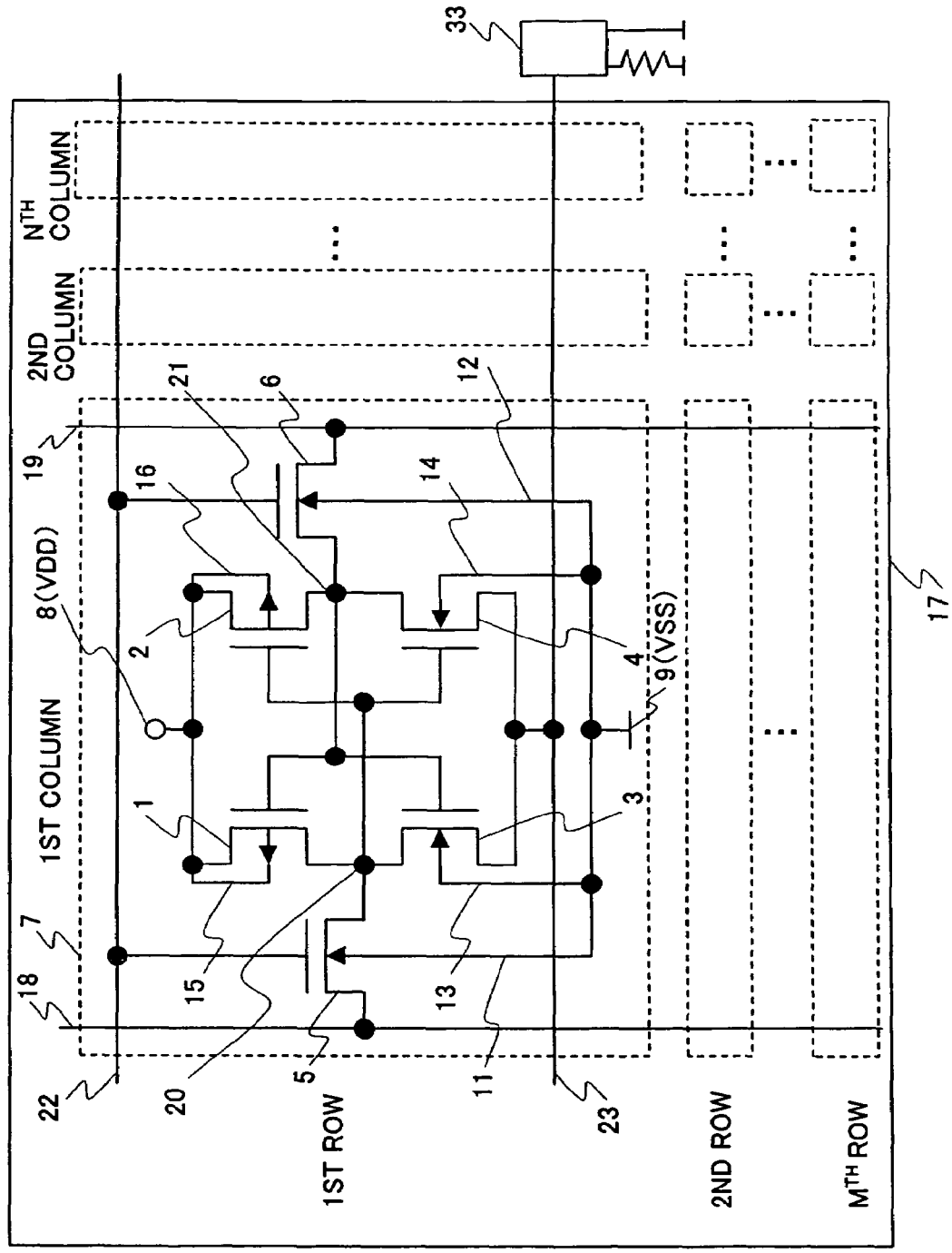
FIG. 17 shows a configuration of a conventional semiconductor memory device.

FIG. 16 shows a configuration of a semiconductor memory device according to a sixth embodiment of the present invention. The semiconductor memory device shown in FIG. 16 includes a memory cell array 110 and a memory cell array 111. The memory cell array 110 includes the memory cells 100, the word line driver circuit 101, the memory cell power supply voltage control circuit 102, the word lines WL1 and WL2, the power supply lines VL1 and VL2, an N-type MOS transistor QN11, an AND circuit AND1 and an inverter INV11. The memory cell array 111 is similar to the memory cell array 110 except for a word line WLR and a power supply line VLR. The memory cell 100, the word line driver circuit 101 and the memory cell power supply voltage control circuit 102 are as described above in the first embodiment, and will not be further described below.

Typically, a semiconductor memory device includes spare memory cell arrays in addition to regular memory cell arrays in order to improve the production yield. During the test of a semiconductor memory device, if there is a defective memory cell in a regular memory cell array, the defective memory cell is replaced with a spare memory cell so that the semiconductor memory device as a whole is non-defective. This is called "redundancy scheme". The semiconductor memory device of the present embodiment includes the memory cell array 111 as a redundancy memory cell array (hereinafter referred to as a "redundancy block") for the regular memory cell array 110.

A configuration of the redundancy block will now be described. The redundancy block receives an external addressing signal ADR and an external redundancy addressing signal RADR. The redundancy addressing signal RADR is branched into two, one of which is inputted to the AND circuit AND1 and the other to the inverter INV11. The redundancy block is controlled by the addressing signal ADR and the redundancy addressing signal RADR. Referring now to FIG. 16, an operation of the redundancy block will be described.

First, a case where the redundancy elements are not used will be described. Where the redundancy elements are not used, the addressing signal ADR and the redundancy addressing signal RADR inputted to the redundancy block are both set to be at the L level. Since the input signals to the AND circuit AND1 are both at the L level, the AND circuit AND1 outputs an L-level signal. The outputted L-level signal is inputted to the word line WLR, thereby inactivating the memory cells 100 included in the redundancy block. Therefore, the memory cells 100 connected to the word line WLR will not affect the bit lines BL1, BL2, /BL1 and /BL2.

The other branch of the redundancy addressing signal RADR is converted to the H level through the inverter INV11, and the converted signal is inputted to the gate electrode of the N-type MOS transistor QN11. The N-type MOS transistor QN11 is turned on as the gate electrode thereof receives the H-level signal. Therefore, the power supply line VLR is grounded, and a memory cell power supply voltage VDDMR will be at the ground level.

In a case where the redundancy elements are not used, a redundancy addressing signal RAD1 inputted to the regular memory cell array is set to be at the H level. Therefore, the AND circuit AND1 included in the regular memory cell array outputs the same signal as the addressing signal AD1. The output signal from the AND circuit AND1 is inputted to the word line driver circuit 101 and the memory cell power supply voltage control circuit 102.

The gate electrode of the N-type MOS transistor QN11 included in the regular memory cell receives the redundancy addressing signal RAD1, which has been converted to the L level through the inverter INV11. Therefore, the N-type MOS transistor is turned off, and the memory cell power supply voltage VDDM1 outputted from the memory cell power supply voltage control circuit 102 is supplied to the power supply line VL1.

As described above, in a case where the redundancy elements are not used, the redundancy block does not affect the regular memory cell array 110, and the regular memory cell array performs its normal operation. In the semiconductor memory device of the present embodiment, the memory cell power supply voltage VDDMR for the inactive memory cells 100 included in the redundancy block is controlled to be at the ground level by the N-type MOS transistor QN11, thereby reducing the leak current from the memory cells 100 and suppressing the power consumption of the semiconductor memory device.

A case where the redundancy elements are used will now be described. For example, it is assumed herein that one of the memory cells 100 connected to the word line WL1 is defective, and the memory cells 100 connected to the word line WL1 are replaced by the memory cells 100 in the redundancy block connected to the word line WLR according to the redundancy scheme. In other words, assume a case where a memory cell array 112 is replaced by the memory cell array 111.

In such a case, the redundancy addressing signal RAD1 is set to be at the L level and the redundancy addressing signals RAD2 and RADR to be at the H level. Moreover, the redundancy addressing signal ADR is selected, instead of the addressing signal AD1. The addressing signal AD1 is set to be at the L level.

The redundancy addressing signal RAD1 and the addressing signal AD1 inputted to the memory cell array 112 are both at the L level, whereby the memory cells 100 connected to the word line WL1 will be inactive. Therefore, the memory cells 100 connected to the word line WL1 will not affect the bit lines BL1, BL2, /BL1 and /BL2. Since an H-level signal is inputted from the inverter INV11 to the gate of the N-type MOS transistor QN11, the power supply line VL1 is grounded and the memory cell power supply voltage VDDM1 will be at the ground level.

Since the redundancy addressing signal RADR is at the H level, the AND circuit AND1 included in the redundancy block outputs the same signal as the addressing signal ADR. The signal outputted from the AND circuit AND1 is inputted to the word line WLR and the memory cell power supply voltage control circuit 102. The gate electrode of the N-type MOS transistor QN11 receives a signal which has been converted to the L level through the inverter INV11. Therefore, the N-type MOS transistor is turned off, and the memory cell power supply voltage VDDMR outputted from the memory cell power supply voltage control circuit 102 is supplied to the power supply line VLR.

As described above, in a case where the redundancy elements are used, the redundancy block operates instead of a regular memory cell array. In the semiconductor memory device of the present embodiment, the memory cells of a defective memory cell array are inactivated, and the memory cell power supply voltage for these memory cells is brought to the ground level by the N-type MOS transistor QN11. Therefore, it is possible to reduce the leak current from the memory cells and suppressing the power consumption of the semiconductor memory device.

The redundancy scheme used in the semiconductor memory device of the present embodiment can easily be used with the semiconductor memory devices of the first to fifth embodiments, and effects similar to those described above can be produced in the other embodiments.

For the sake of simplicity, a semiconductor memory device of the present invention is shown to have only a limited number of these components: the memory cell 100, the word line driver circuit 101, the memory cell power supply voltage control circuit 102 or 202, the OR circuit OR1, the memory cell power supply voltage compensation circuit 106 or 107, the memory cell holding reference voltage generation circuit 109, the bit line precharge circuit 300, the bit line precharge control circuit 301, the inverter INV11, the AND circuit AND1, the N-type MOS transistor QN11, etc., as shown in FIGS. 1, 5, 7, 8, 11 and 16. However, there may be a larger number of each of these components. It is understood that such a semiconductor memory device will produce the same effects as those of the semiconductor memory devices of the present invention described above.

While the invention has been described in detail, the foregoing description is in all aspects illustrative and not restrictive. It is understood that numerous other modifications and variations can be devised without departing from the scope of the invention.

What is claimed is:

1. A semiconductor memory device with a power supply voltage control function, comprising:

a plurality of word lines;

a plurality of bit lines;

a plurality of power supply lines;

a plurality of memory cells connected to the word lines, the bit lines and the power supply lines;

a plurality of word line driver circuits, each of which drives each of the corresponding word lines; and a plurality of memory cell power supply voltage control circuits each of which supplies a predetermined power supply voltage via a power supply line to the memory cell that is connected to a word line being active, and supplies, via a power supply line to a memory cell that is connected to a word line being inactive, a voltage that is lower than the predetermined power supply voltage and is greater than or equal to a lowest possible level with which the memory cells can hold data, wherein:

the number of gates provided between an input and an output of each word line driver circuit is larger than the number of gates provided between an input and an output of each memory cell power supply voltage circuit;

the memory cell power supply voltage control circuit includes first to third transistors;

the first transistor is connected to a power supply terminal, to which the predetermined power supply voltage is applied, and the second transistor;

the second transistor is connected in a diode-type gate connection between the first transistor and the third transistor;

the third transistor is connected to the second transistor and a ground terminal; and the first and third transistors are controlled based on an external addressing signal.

2. The semiconductor memory device according to claim 1, wherein an absolute value of a threshold voltage of the second transistor is greater than or equal to a maximum threshold voltage among all transistors included in the memory cell.

3. The semiconductor memory device according to claim 2, wherein the memory cell power supply voltage control circuit outputs the predetermined power supply voltage when the addressing signal exhibits an active state and outputs the threshold voltage of the second transistor when the addressing signal exhibits an inactive state.

4. The semiconductor memory device according to claim 1, wherein the memory cell power supply voltage control circuit supplies the predetermined power supply voltage to the memory cell before the word line becomes active.

5. The semiconductor memory device according to claim 1, wherein the memory cell power supply voltage control circuit supplies the same power supply voltage to a plurality of the memory cells connected to a plurality of the word lines.

6. The semiconductor memory device according to claim 1, wherein:

the power supply line extends in a substrate potential supplying region in a memory cell array including the memory cell;

the memory cell power supply voltage control circuit is provided in a region adjacent to the substrate potential supplying region and adjacent to a word line driver circuit region.

7. The semiconductor memory device according to claim 1, further comprising a memory cell power supply voltage compensation circuit for preventing the power supply voltage supplied to the memory cell from becoming lower than the lowest possible level with which the memory cell can hold data.

8. The semiconductor memory device according to claim 7, wherein the memory cell power supply voltage compensation circuit includes a charge-supplying element connected to a power supply terminal, to which the predetermined power supply voltage is applied, and the power supply line.

9. The semiconductor memory device according to claim 7, wherein:

the memory cell power supply voltage control circuit includes first to third transistors;

the first transistor is connected to a power supply terminal, to which the predetermined power supply voltage is applied, and the second transistor;

the second transistor is connected in a diode-type gate connection between the first transistor and the third transistor;

the third transistor is connected to the second transistor and a ground terminal;

the first and third transistors are controlled based on an external addressing signal; and the first transistor functions as the memory cell power supply voltage compensation circuit.

10. The semiconductor memory device according to claim 7, wherein the memory cell power supply voltage compensation circuit includes:

a comparator circuit for comparing a power supply voltage supplied to the memory cell via the power supply line with a reference voltage of the power supply voltage; and a switching element for electrically connecting and shorting together a power supply terminal, to which the predetermined power supply voltage is applied, and the power supply line according to a signal outputted from the comparator circuit, wherein the power supply voltage supplied to the memory cell is kept to be greater than or equal to the reference voltage.

11. The semiconductor memory device according to claim 10, wherein the comparator circuit and the switching element stop operating when an external addressing signal exhibits an active state.

12. The semiconductor memory device according to claim 1, further comprising:

a bit line precharge control signal line for carrying a control signal for controlling whether or not to precharge the bit line;

a bit line precharge circuit connected to the bit line and the bit line precharge control signal line for precharging the bit line based on the control signal; and a bit line precharge control circuit for outputting the control signal to the bit line precharge control signal line based on an external signal, wherein when the word line transitions from an active state to an inactive state, the bit line precharge control circuit supplies a charge stored in the power supply line of the memory cell that is connected to the word line to the bit line precharge control signal line.

13. The semiconductor memory device according to claim 1, further comprising a redundancy block, wherein:

redundancy block includes a redundancy memory cell that can be used as a replacement for the memory cell, and a switching element for controlling a power supply voltage supplied to the redundancy memory cell to be either a power supply voltage supplied from the memory cell power supply voltage control circuit or a ground potential; and the switching element outputs the ground potential in a redundancy block including a redundancy memory cell that is not used as a replacement for the memory cell.

14. The semiconductor memory device according to claim 1, further comprising:

a redundancy memory cell that can be used as a replacement for the memory cell; and a switching element for controlling a power supply voltage supplied to the memory cell to be either a power supply voltage supplied from the memory cell power supply voltage control circuit or a ground potential, wherein the switching element outputs the ground potential in a memory cell that is replaced by the redundancy memory cell.

15. A semiconductor memory device with a power supply voltage control function, comprising:

a plurality of word lines;

a plurality of bit lines;

a plurality of power supply lines;

a plurality of memory cells connected to the word lines, the bit lines, and the power supply lines; and a plurality of memory cell power supply voltage control circuits, each of which supplies a predetermined power supply voltage via a power supply line to the memory cell that is connected to a word line being inactive, and supplies, via a power supply line to a memory cell that is connected to a word line being inactive, a voltage that is lower than the predetermined power supply voltage and is greater than or equal to a lowest possible level with which the memory cells can hold data, wherein the memory cell power supply voltage control circuit supplies the predetermined power supply voltage to the memory cell before the word line becomes active.

* * * * *